(12) United States Patent
Ho et al.

(10) Patent No.: US 11,164,789 B1
(45) Date of Patent: Nov. 2, 2021

(54) METHOD FOR FORMING SEMICONDUCTOR DEVICE THAT INCLUDES COVERING METAL GATE WITH MULTILAYER DIELECTRIC

(71) Applicant: TAIWAN SEMICONDUCTOR MANUFACTURING CO., LTD., Hsinchu (TW)

(72) Inventors: Tsai-Jung Ho, Changhua County (TW); Yu-Shih Wang, Tainan (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/852,191

(22) Filed: Apr. 17, 2020

(51) Int. Cl.
| | | |
|---|---|---|
| *H01L 29/66* | (2006.01) |
| *H01L 21/8234* | (2006.01) |
| *H01L 21/467* | (2006.01) |
| *H01L 21/321* | (2006.01) |
| *H01L 21/02* | (2006.01) |
| *H01L 21/311* | (2006.01) |
| *H01L 21/3213* | (2006.01) |

(52) U.S. Cl.
CPC ...... *H01L 21/82345* (2013.01); *H01L 21/022* (2013.01); *H01L 21/0217* (2013.01); *H01L 21/0228* (2013.01); *H01L 21/02126* (2013.01); *H01L 21/02274* (2013.01); *H01L 21/31111* (2013.01); *H01L 21/3212* (2013.01); *H01L 21/32133* (2013.01); *H01L 21/467* (2013.01); *H01L 21/823431* (2013.01); *H01L 21/823437* (2013.01); *H01L 29/6656* (2013.01); *H01L 29/66545* (2013.01); *H01L 29/66795* (2013.01)

(58) Field of Classification Search
CPC ......... H01L 21/02123; H01L 21/02126; H01L 21/0214; H01L 21/0217; H01L 21/022; H01L 21/02211; H01L 21/02274; H01L 21/0228; H01L 21/304; H01L 21/31111; H01L 21/32133; H01L 21/47573; H01L 21/47635; H01L 21/823437; H01L 29/4236; H01L 29/42372; H01L 29/42376; H01L 29/66545; H01L 29/6656
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| (Continued) | | |

*Primary Examiner* — Stephen W Smoot
(74) *Attorney, Agent, or Firm* — Maschoff Brennan

(57) ABSTRACT

A method includes forming a dummy gate structure over a substrate; forming a plurality of gate spacers on opposite sidewalls of the dummy gate structure; forming an interlayer dielectric (ILD) layer surrounding the gate spacers; replacing the dummy gate structure with a metal gate structure; etching back the metal gate structure to form a gate trench between the gate spacers; depositing a first dielectric layer in the gate trench, in which the first dielectric layer has horizontal portions over the metal gate structure and the ILD layer, and vertical portions on sidewalls of the gate spacers; etching the vertical portions of the first dielectric layer until the sidewalls of the gate spacers exposed; and performing depositing the first dielectric layer and etching the vertical portions of the first dielectric layer in an alternate manner.

20 Claims, 25 Drawing Sheets

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 9,871,116 B2 * | 1/2018 | Basker | H01L 29/6653 |
| 2015/0076624 A1 * | 3/2015 | Liu | H01L 21/823842 |
| | | | 257/412 |
| 2015/0118836 A1 * | 4/2015 | Lin | H01L 21/28247 |
| | | | 438/586 |
| 2016/0056262 A1 * | 2/2016 | Ho | H01L 29/4966 |
| | | | 257/288 |
| 2016/0351711 A1 * | 12/2016 | Bae | H01L 29/4236 |
| 2017/0047253 A1 * | 2/2017 | Park | H01L 21/823821 |
| 2017/0186692 A1 * | 6/2017 | Zhao | H01L 21/0214 |
| 2018/0190499 A1 * | 7/2018 | Chen | H01L 29/517 |
| 2019/0103276 A1 * | 4/2019 | Peng | H01L 21/02208 |
| 2020/0075720 A1 * | 3/2020 | Cheng | H01L 21/02603 |

* cited by examiner

METHOD FOR FORMING SEMICONDUCTOR DEVICE THAT INCLUDES COVERING METAL GATE WITH MULTILAYER DIELECTRIC

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 19 illustrate a method in various stages of fabricating a semiconductor device in accordance with some embodiments of the present disclosure, in which

DETAILED DESCRIPTION

Figure 1:
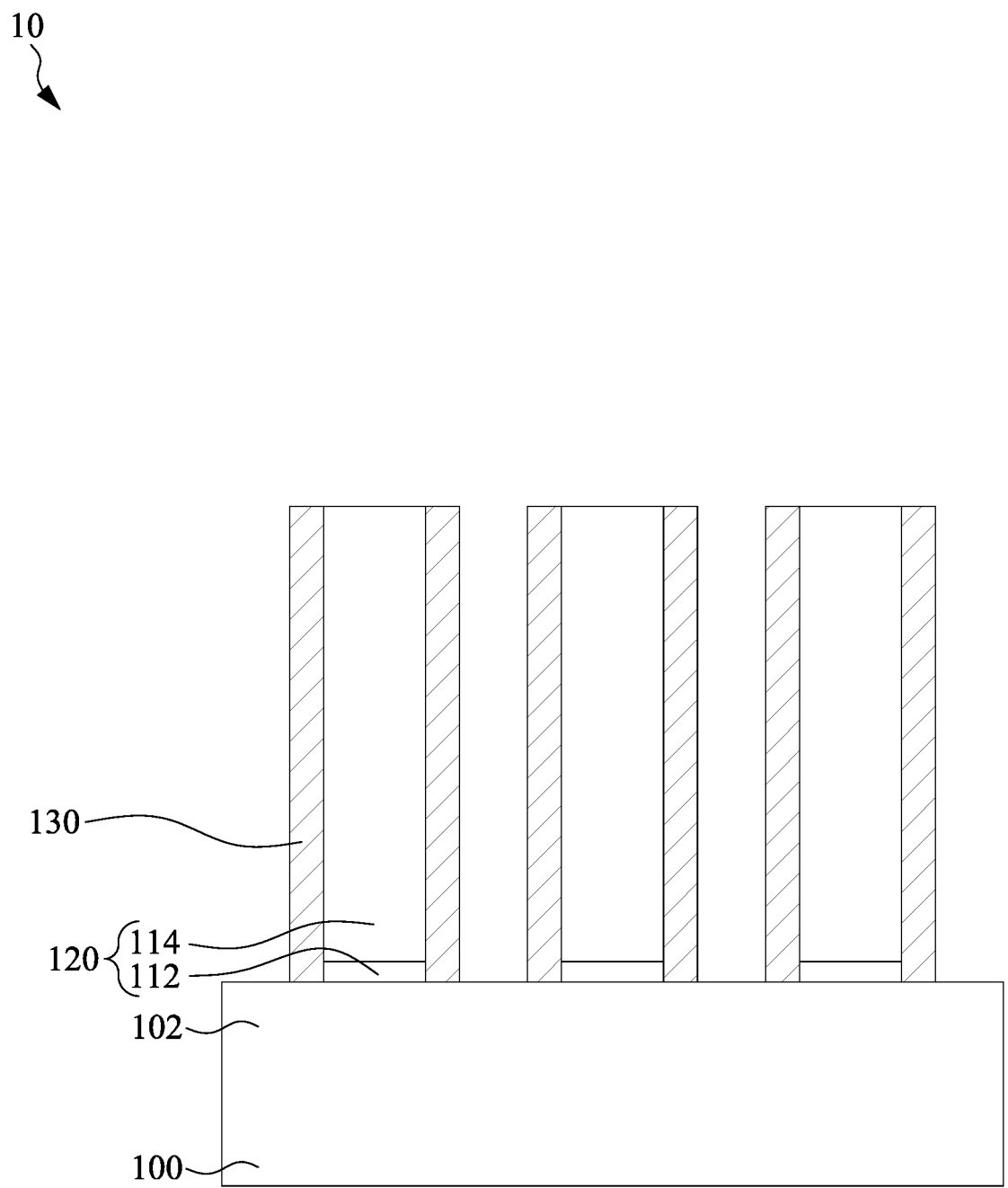

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 to 19 illustrate a method in various stages of fabricating a semiconductor device in accordance with some embodiments of the present disclosure.

Reference is made to FIG. 1. Shown there is a semiconductor structure 10. The semiconductor structure 10 includes a substrate 100. The substrate 100 includes a fin structure 102. In some embodiments, the fin structure 102 may be formed by, for example, forming a patterned mask layer, which defines the position of the fin structure 102, over the substrate 100, and followed by one or more etching processes to partially remove the substrate 100 to form at least one fin-like structure protruded from the top surface of the substrate 100. In some embodiments, a plurality of isolation dielectric structure as shallow trench isolation (STI) may be formed adjacent to the fin structure.

In some embodiments, the substrate 100 includes silicon. Alternatively, the substrate 100 may include germanium, silicon germanium, gallium arsenide or other appropriate semiconductor materials. Also alternatively, the substrate 100 may include an epitaxial layer. For example, the substrate 100 may have an epitaxial layer overlying a bulk semiconductor. Further, the substrate 100 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 100 may include a semiconductor-on-insulator (SOI) structure. Also alternatively, the substrate 100 may include a buried dielectric layer, such as a buried oxide (BOX) layer, such as that formed by separation by implantation of oxygen (SIMOX) technology, wafer bonding, SEG, or other appropriate method.

A plurality of dummy gate structures 110 are formed over the fin structure 102. In some embodiments, each of the dummy gate structures 110 includes a gate dielectric layer 112 and a dummy gate electrode 114. In some embodiments, the dummy gate structures 110 may be formed by, for example, depositing a gate dielectric material and a dummy gate electrode material in sequence over the fin structure 102, followed by a photolithography process to pattern the gate dielectric material and the dummy gate electrode material to form the dummy gate structures 110, in which each of the dummy gate structures 120 includes the respective remaining portions of the gate dielectric material and the dummy gate electrode material after the patterning. In some embodiments, each of the dummy gate structures 110 may include a hard mask (not shown) over the dummy gate electrode 114.

The gate dielectric layer 112 may be, for example, silicon oxide, silicon nitride, a combination thereof, or the like, and may be deposited or thermally grown according to acceptable techniques. The gate dielectric layer 112 may be formed by suitable process, such as chemical vapor deposition (CVD), physical vapor deposition (PVD), atomic layer deposition (ALD), or any suitable process. The dummy gate electrode 114 may include polycrystalline-silicon (poly-Si) or poly-crystalline silicon-germanium (poly-SiGe). Further, the dummy gate electrode 114 may be doped poly-silicon with uniform or non-uniform doping. The dummy gate electrode 114 may be formed by suitable process, such as chemical vapor deposition (CVD), physical vapor deposition (PVD), atomic layer deposition (ALD), or any suitable process.

A plurality of gate spacers 130 are formed on opposite sidewalls of the dummy gate structures 120, respectively. The gate spacers 130 may be formed by, for example, depositing a spacer layer blanket over the dummy gate structures 120, and followed by an etching process to remove horizontal portions of the spacer layer, such that vertical portions of the spacer layer remain on sidewalls of the dummy gate structures 120. In some embodiments, the gate spacers 130 may include $SiO_2$, $Si_3N_4$, $SiO_xN_y$, SiC, SiCN films, SiOC, SiOCN films, and/or combinations thereof. In some embodiments, each of the gate spacers 130 includes multiple layers, such as main spacer walls, liner layers, and the like. In some embodiments, the gate spacers 130 may be formed by CVD, SACVD, flowable CVD, ALD, PVD, or other suitable process.

Figure 2:
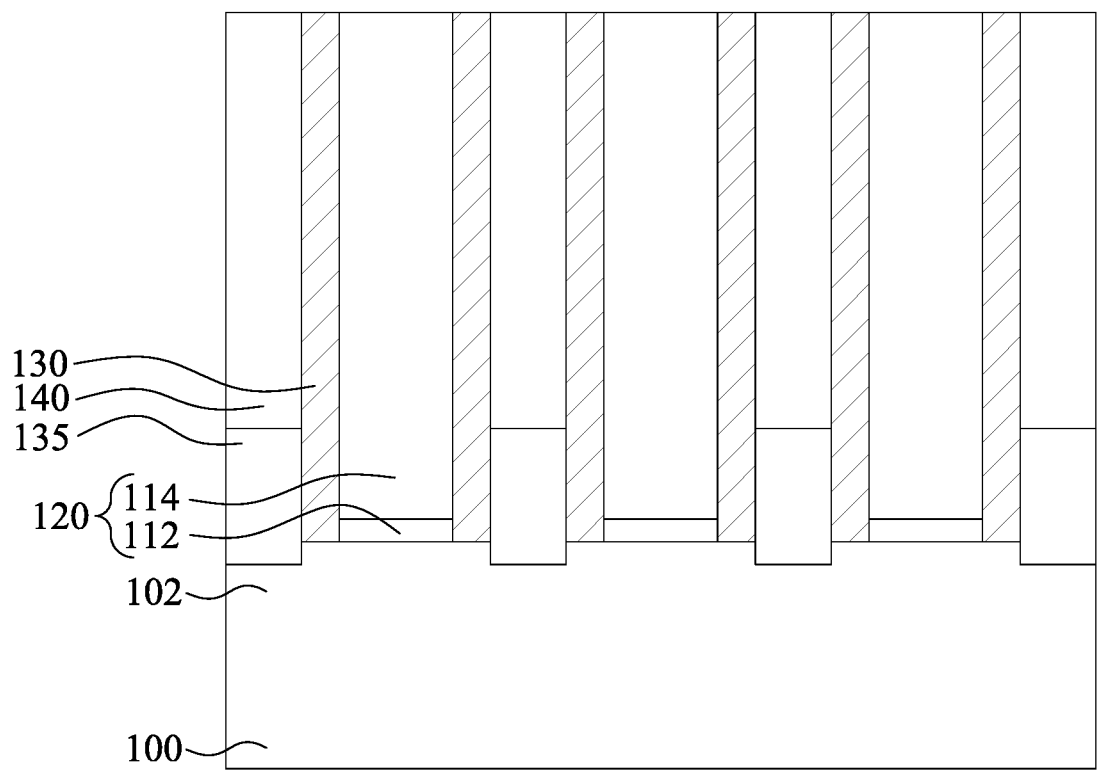

Reference is made to FIG. 2. Source/drain structures 135 are formed in the fin structure 102. For example, the fin structure 102 exposed by the dummy gate structures 120 and the gate spacers 130 is recessed by suitable process, such as etching. Afterwards, the source/drain structures 135 are formed respectively over the exposed surfaces of the remaining fin structure 102. The source/drain structures 135 may be formed by performing an epitaxial growth process that provides an epitaxy material over the fin structure 102, and thus the source/drain structures 135 can also be interchangeably referred to as epitaxy structures 135 in this context. In various embodiments, the source/drain structures 135 may include Ge, Si, GaAs, AlGaAs, SiGe, GaAsP, SiP, or other suitable material.

An interlayer dielectric (ILD) layer 140 is formed adjacent to the gate spacers 130 and surrounding the dummy gate structures 120. For example, a dielectric layer is deposited blanket over the substrate 100 and filling the spaces between the gate spacers 130, and followed by a CMP process to remove excessive material of the dielectric layer until top surfaces of the dummy gate structures 122 and 124 are exposed. In some embodiments, the ILD layer 140 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 140 may be formed using, for example, CVD, ALD, spin-on-glass (SOG) or other suitable techniques.

Figure 3:
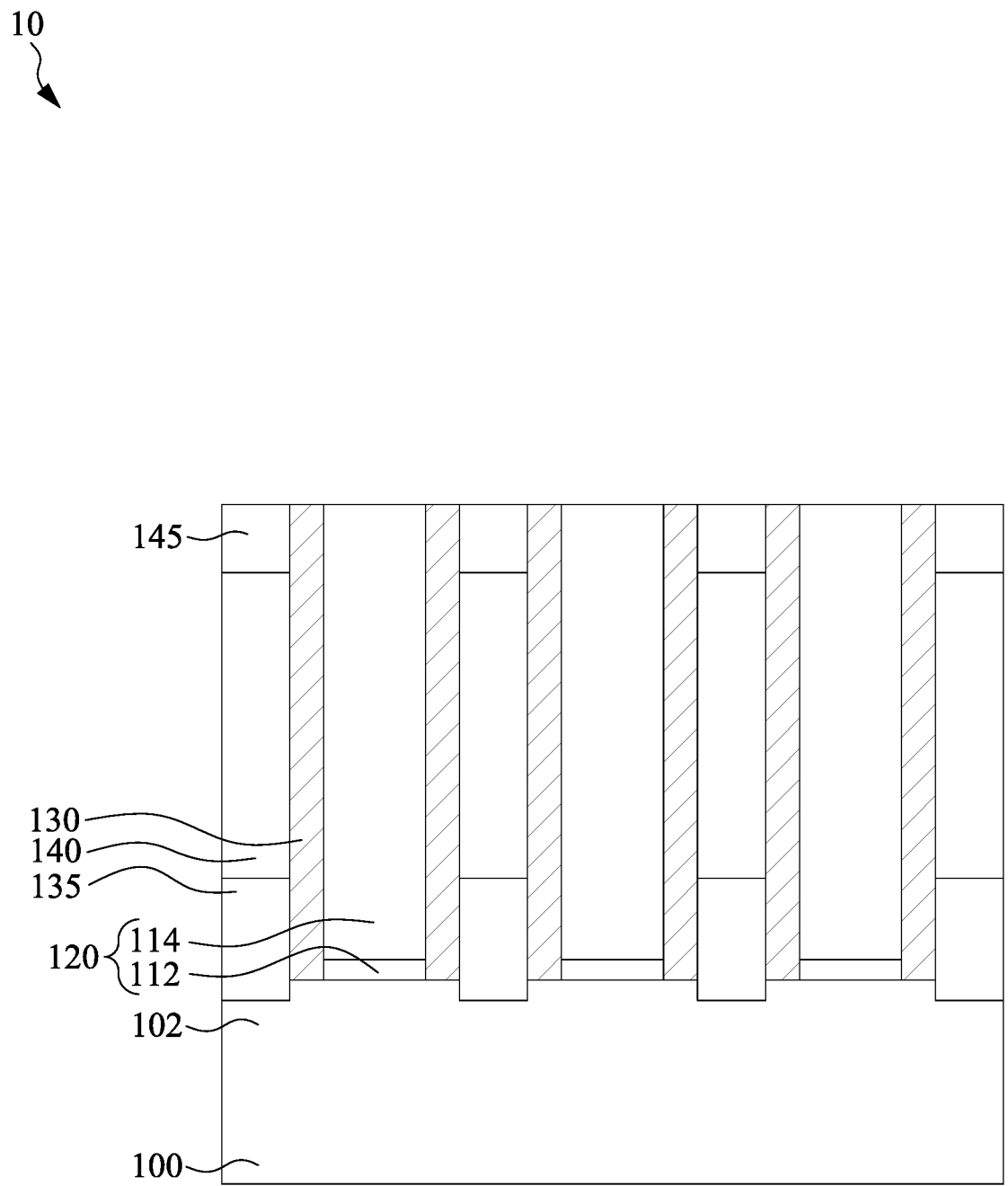

Reference is made to FIG. 3. The ILD layer 140 is etched back, and a plurality of hard masks 145 are formed over the etched ILD layer 140. For example, the ILD layer 140 is etched back to form a plurality of recesses between the gate spacers 130, in which the gate spacers 130 have a higher etching resistance to the etchant of the etching process. Then, a dielectric material is formed over the ILD layer 140 and filling the recesses, followed by a CMP process to remove excessive dielectric material outside the recesses. The remaining portions of the dielectric material in the recesses are referred to as hard masks 145. In some embodiments, the hard masks 145 may include $SiO_2$, $Si_3N_4$, $SiO_xN_y$, SiC, SiCN films, SiOC, SiOCN films, and/or combinations thereof. In some embodiments, the hard masks 145 may be formed by CVD, ALD, PVD, or other suitable process.

Figure 4:
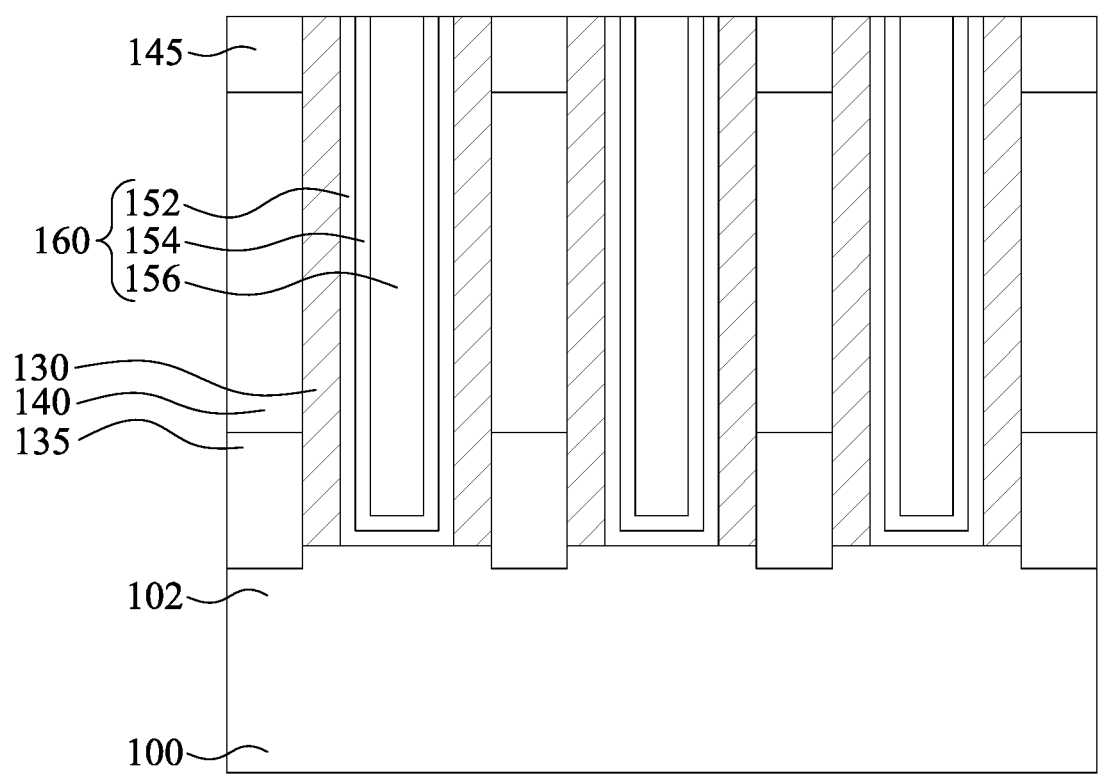

Reference is made to FIG. 4. The dummy gate structures 120 are replaced with metal gate structures 160. In some embodiments, each of the metal gate structures 160 includes a gate dielectric layer 152, a work function metal layer 154 over the gate dielectric layer 152, and a gate electrode 156 over the work function metal layer 154. In some embodiments, the metal gate structures 160 may be formed by, for example, removing the dummy gate structures 120 to form gate trenches between the gate spacers 130, sequentially depositing a gate dielectric material, a work function metal material, and a gate electrode material in the trenches, and followed by a CMP process to remove excessive gate dielectric material, work function metal material, and gate electrode material until the top surfaces of the hard masks 145 are exposed to form the metal gate structures 160.

In some embodiments, the gate dielectric layer 152 may include high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some embodiments, the work function metal layer 154 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the gate electrode 156 may include tungsten (W). In some other embodiments, the gate electrode 156 includes aluminum (Al), copper (Cu) or other suitable conductive material.

Figure 5:
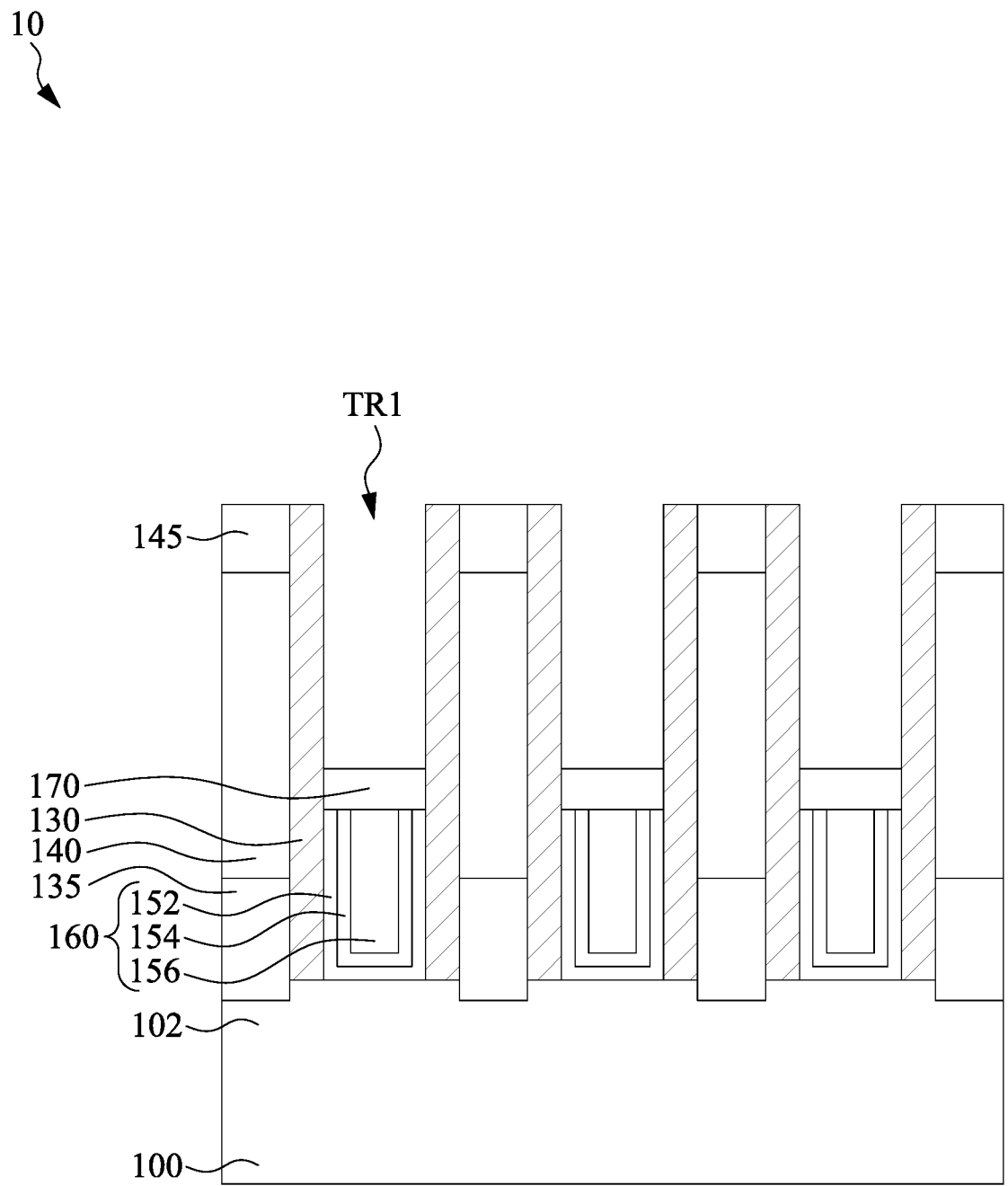

Reference is made to FIG. 5. The metal gate structures 160 are etched back to form gate trenches TR1 between the gate spacers 130, and a plurality of metal layers 170 are formed over the metal gate structures 160, respectively. In some embodiments, the metal gate structures 160 may be etched back using suitable etching process, such as wet etching, dry etching, or combinations thereof. In some embodiments, the metal layer 196 may include but not limited to, for example, tungsten (W). In some embodiments, the metal layers 170 can be formed by suitable deposition process, such as ALD, CVD, or other suitable deposition process.

In some embodiments, the metal layers 170 are selectively formed on the metal gate structures 160 via a bottom-up approach. In a bottom-up approach, the growth of metal layers 170 has a different nucleation delay on a metal-containing surface (i.e., the metal gate structures 160) as compared to a dielectric surface (i.e., the gate spacers 130 and the hard masks 145). Usually, the nucleation delay on the metal-containing surface is shorter than on the dielectric surface. The nucleation delay differences can be used to allow selective growth on the metal-containing surface. The present disclosure utilizes the selectivity to allow metal growth from a bottom of a trench (i.e. the metal gate structures 160) while limiting the growth from the dielectric side walls (i.e. the gate spacers 130 and the hard masks 145). As a result, the deposition rate of the metal layers 170 on the metal-containing surface (i.e., the metal gate structures 160) is faster than that on the dielectric surface (i.e., the gate spacers 130 and the hard masks 145). In some embodiments as shown in FIG. 5, the metal layers 170 are selectively formed on the metal gate structures 160, while the metal layers 170 are not formed on the gate spacers 130 and the hard masks 145.

Figure 6A:
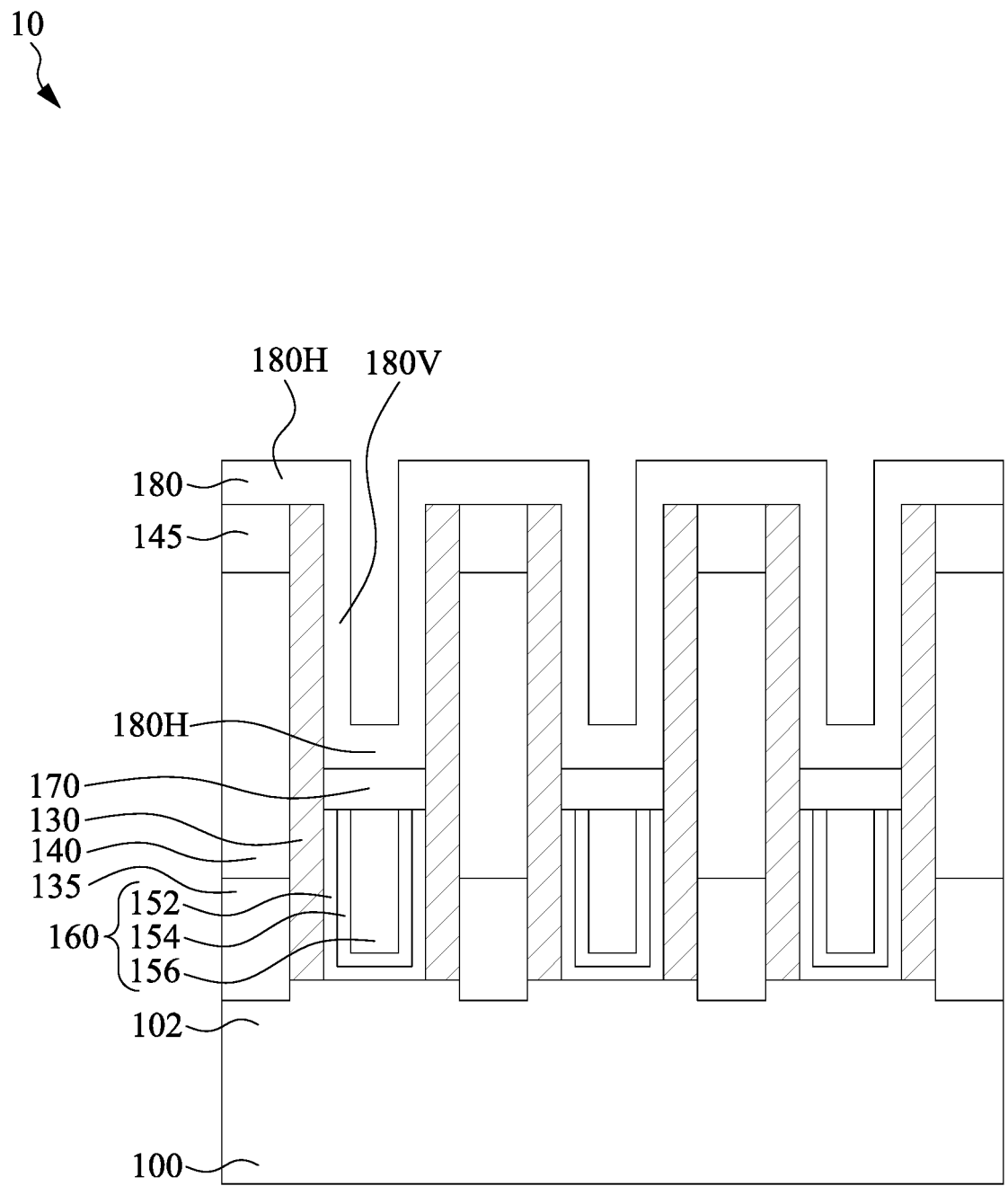
Figure 6B:
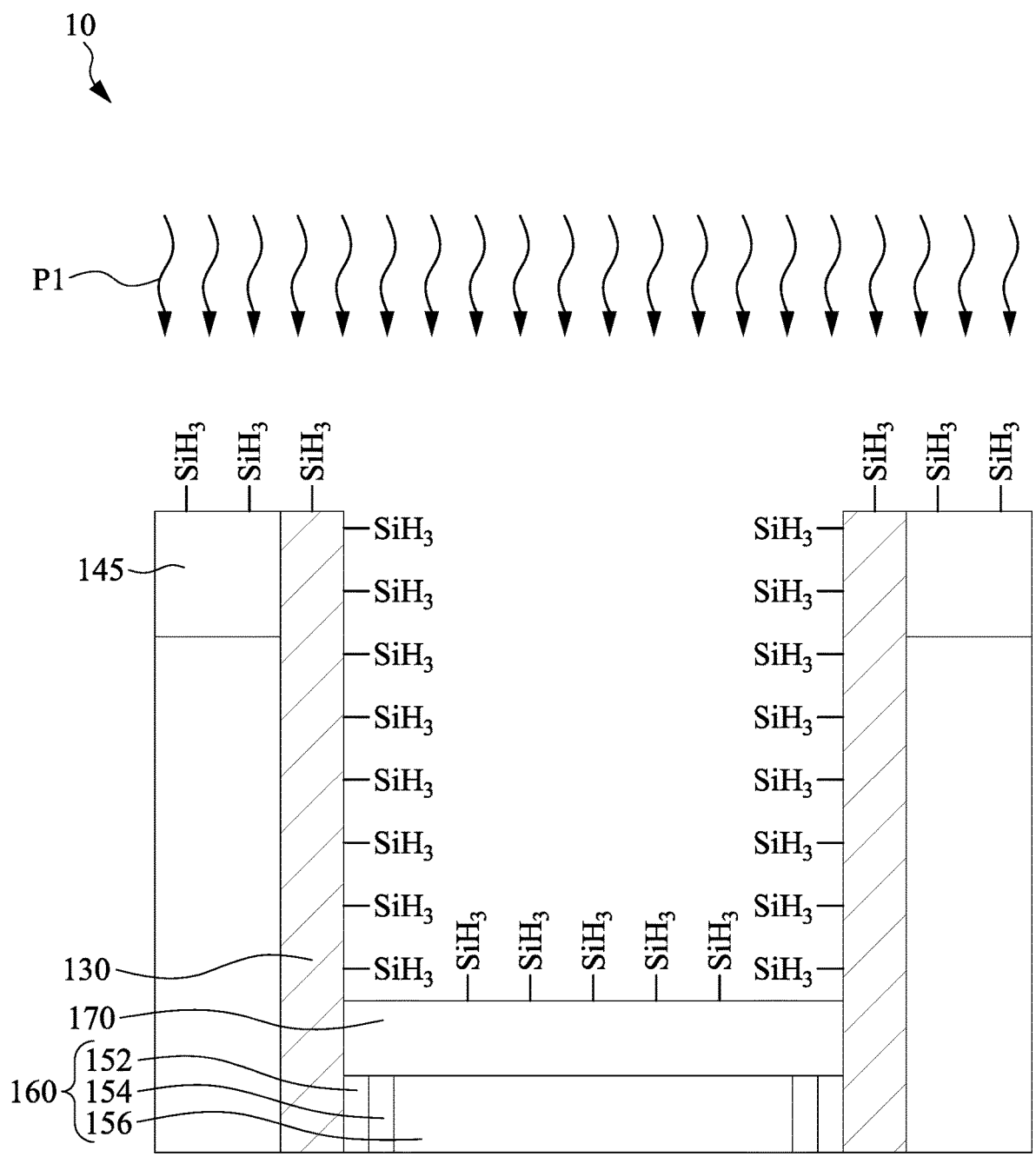
FIGS. 6B to 6D illustrate a method for forming a dielectric layer of FIG. 6A.
Figure 6C:
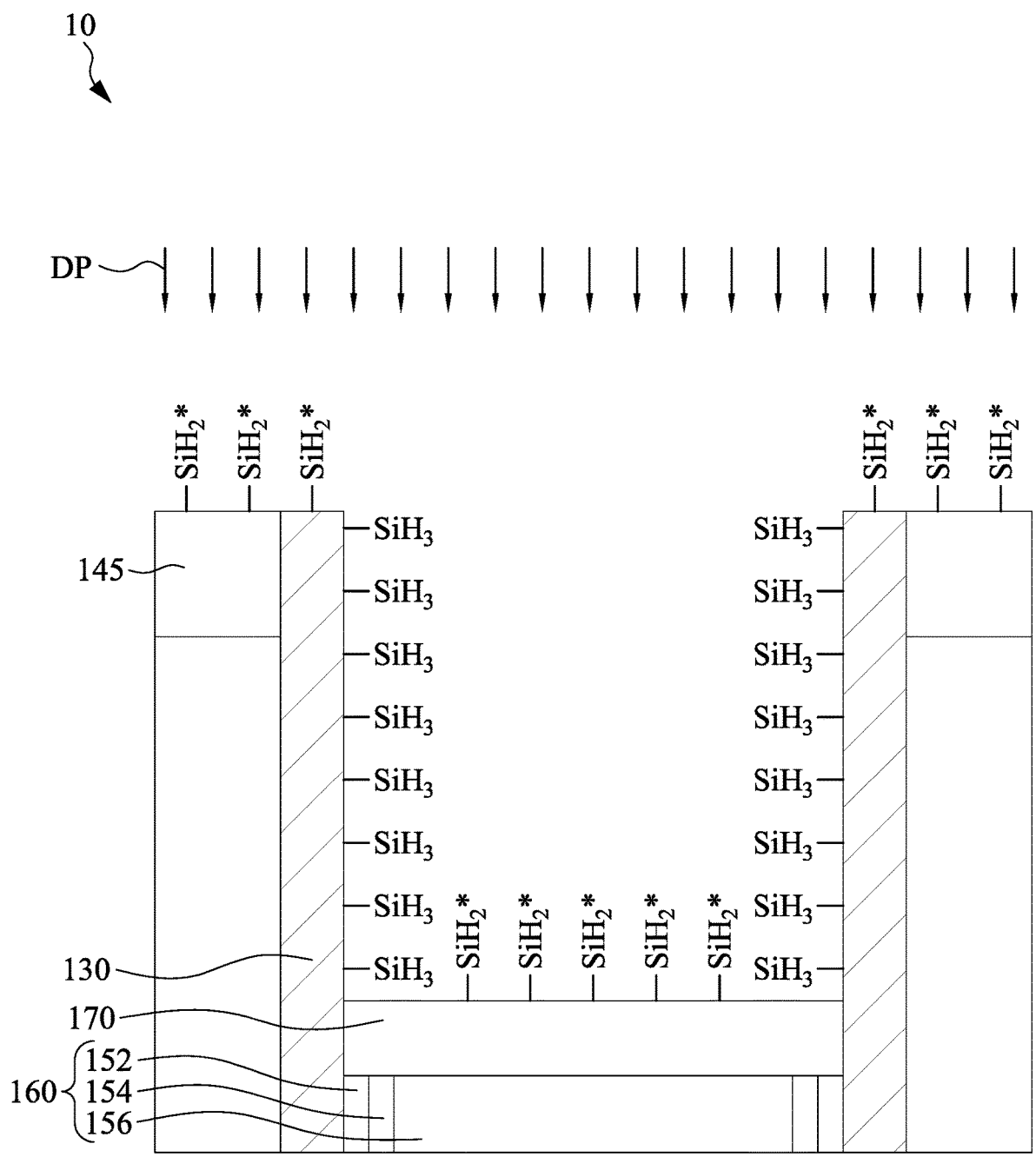
Figure 6D:
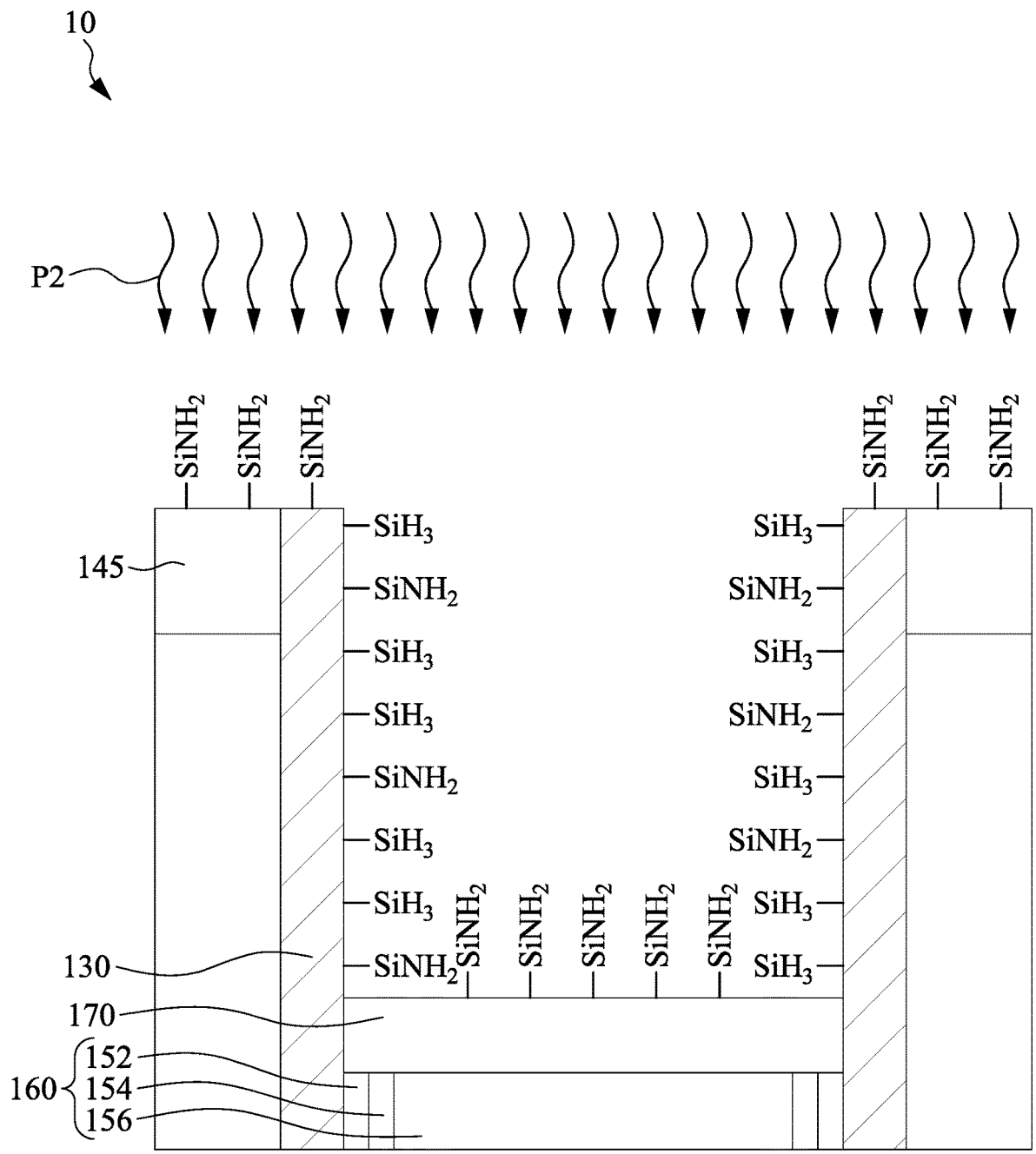
Figure 6E:
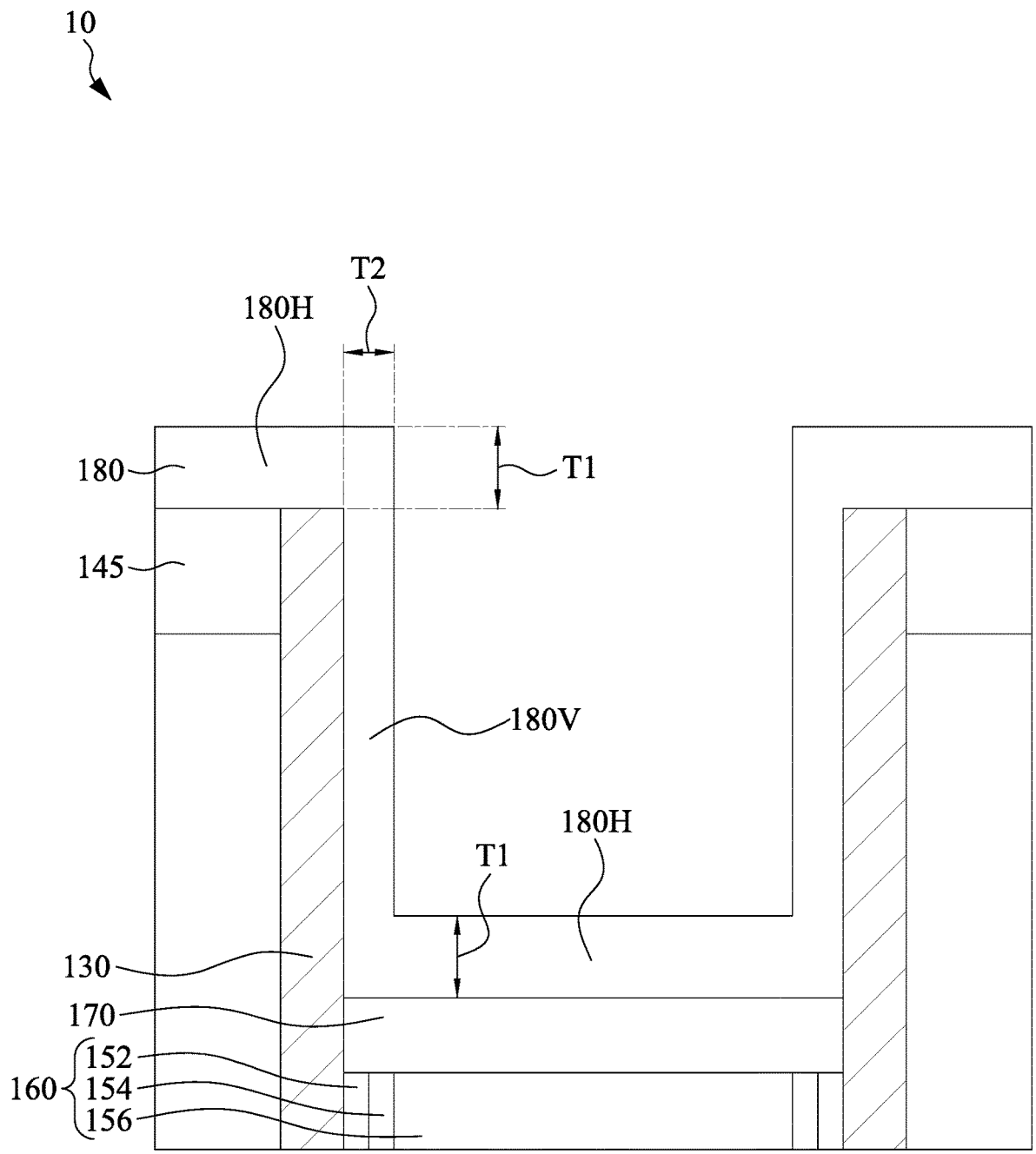
FIG. 6E is an enlarged view of FIG. 6A.

Reference is made to FIGS. 6A to 6E, in which FIGS. 6B to 6D illustrate a method for forming the dielectric layer 180 of FIG. 6A, and FIG. 6E is an enlarged view of FIG. 6A. In FIG. 6A, a dielectric layer 180 is formed to line the hard masks 145, the gate spacers 130, and the metal layers 170. In some embodiments, the dielectric layer 180 may include SiN, $SiO_2$, $Si_3N_4$, $SiO_xN_y$, SiC, SiCN films, SiOC, SiOCN films, and/or combinations thereof. For example, the dielectric layer 180 may include SiN. In some embodiments, the dielectric layer 180 may be deposited by a deposition process including a directional plasma activation, such as a Plasma Enhanced ALD (PEALD), CVD, or another deposition technique. Additional details of example deposition processes and the dielectric layer 180 are described below, such as with respect to FIGS. 6B to 6E.

FIGS. 6B to 6E are cross-sectional views of respective intermediate structures at intermediate stages in an example of Plasma Enhanced ALD (PEALD) process for forming the dielectric layer 180 in the semiconductor structure 10 in accordance with some embodiments. In a PEALD process, the semiconductor structure 10 may be transferred to a PEALD process chamber, two or more precursors are introduced into the process chamber, and the plasma is utilized to activate at least one of the precursors, so as to form the dielectric layer 180 in the semiconductor structure 10. It is noted that, FIGS. 6B to 6E are enlarged views of FIG. 6A to clearly describe the formation of the dielectric layer 180.

In FIG. 6B, the semiconductor structure 10 is exposed to a first precursor P1 to from a monolayer on the semiconductor structure 10. In some embodiments, the first precursor P1 may include dichlorosilane $SiH_2Cl$ (DCS) or another precursor depending on the material to be deposited, for example. In the illustrated example, the first precursor P1 is a DCS precursor, and is used to form a monolayer of $SiH_3$ along exterior surfaces of the semiconductor structure 10 exposed to the DCS precursor. For example, the monolayer of $SiH_3$ is formed on top surfaces of the hard masks 145, top surfaces and sidewalls of the gate spacers 130, and a top surface of the metal layer 170. In some other embodiments, a different precursor may be used, which may form a monolayer of a different material. After the exposure to the first precursor P1, the first precursor P1 may be purged from the PEALD process chamber. In some embodiments, the first precursor P1 can be flowed in the plasma process at a flow rate in a range from about 100 sccm to about 20000 sccm. In some embodiments, the duration of the exposure to the first precursor P1 is in a range from about 0.1 s to about 10 s.

FIG. 6C illustrates a directional plasma activation performed on the monolayer. As illustrated, a directional plasma DP (or anisotropic plasma) is provided to the semiconductor structure 10, and activates portions of the monolayer for increasing the reaction of monolayer with a subsequent precursor (e.g., the precursor P2 of FIG. 6D). In some embodiments, the incidence direction of the directional plasma DP is substantially vertical to a top surface of the substrate 100. In greater detail, the incidence direction of the directional plasma DP is substantially vertical to top surfaces of the hard masks 145, top surfaces of the gate spacers 130, and top surface of the metal layer 170.

The directional plasma DP is used to activate portions of the monolayer of $SiH_3$ on the exposed surfaces of the semiconductor structure 10 to modify the $SiH_3$ to activated $SiH_2^*$. In some embodiments, due to the nature of the directional plasma DP, portions of the monolayer on respective surfaces of the semiconductor structure 10 that have horizontal components are activated by the directional plasma DP, whereas portions of the monolayer on respective surfaces that do not have a horizontal component may not be activated (or less activated) by the directional plasma DP. For example, because the top surfaces of hard masks 145, the top surfaces of the gate spacers 130, and the top surface of the metal layer 170 are substantially vertical to the incidence direction of the directional plasma DP, the directional plasma DP can easily reach these surfaces and modify portions of the monolayer of $SiH_3$ on these surfaces to activated $SiH_2^*$.

On the other hand, because the sidewalls of the gate spacers 130 are substantially parallel to the incidence direction of the directional plasma DP, it's hard for the directional plasma DP to reach these regions. Accordingly, portions of the monolayer of $SiH_3$ on the sidewalls of the gate spacers 130 are not activated. In some embodiments, portions of the monolayer of $SiH_3$ on the sidewalls of the gate spacers 130 may be activated, but may be less activated than other portions of the monolayer of $SiH_3$ on the top surfaces of hard masks 145, the top surfaces of the gate spacers 130, and the top surface of the metal layer 170.

In some embodiments, the top surfaces of hard masks 145, the top surfaces of the gate spacers 130, and the top surface of the metal layer 170 can be referred to as "activated portions", while the sidewalls of the gate spacers 130 can be referred to as "non-activated portions" or "less-activated portions." Here, the term "non-activated portions" indicates that the portions are not activated by the directional plasma DP or the amount of the activated regions on these portions is negligible small. The term "less-activated portions" indicates that the activated $SiH_2^*$ per unit area on these portions is less than the activated $SiH_2^*$ per unit area on "activated portions."

In some embodiments, the directional plasma DP may include argon (Ar). In some examples, the plasma process implemented to activate the monolayer can be a microwave remote plasma, although other plasma sources, such as a direct plasma, may be implemented. In some embodiments, a flow rate of the argon (Ar) gas for the plasma can be in a range from about 1000 sccm to about 20000 sccm. A pressure of the plasma process can be in a range from about 1 Torr to about 10 Torr. A temperature of the plasma process can be in a range from about 250 C. to about 500 C. A power of the plasma generator of the plasma process can be in a range from about 100 to about 1000 W. In other examples, a different plasma, such as a different plasma process, conditions, and/or gas (such as an inert gas, nitrogen gas, or the like), may be used to activate portions of the monolayer. By activating the portions of the monolayer with the directional plasma DP, more reaction sites may be created on the activated portions of the monolayer to react with a subsequent precursor in the PEALD process. The directional plasma DP may be performed in situ in the same tool chamber used to expose the intermediate structure to the first precursor and, subsequently, a second precursor.

FIG. 6D illustrates a layer formed on the semiconductor structure 10 by exposing the semiconductor structure 10 to a second precursor P2 in the PEALD process. It is noted that the processes of FIG. 6C and FIG. 6D may be performed simultaneously. That is, the directional plasma DP of FIG. 6C and the second precursor P2 of FIG. 6D may be provided to the semiconductor structure 10 at the same time.

The semiconductor structure 10 is exposed to the second precursor P2, such as an ammonia ($NH_3$) plasma and/or nitrogen ($N_2$) plasma, and/or other precursor depending on the material to be deposited, for example. The second precursor P2 reacts with the activated portions of the monolayer more than the non-activated portions (or less-activated portions) of the monolayer. For example, due to the increased reaction sites formed on the activated portions of the monolayer from the directional plasma DP (see FIG. 6C), more reactions between activated portions of monolayer at the top surfaces of the hard masks 145, the top surfaces of the gate spacers 130, and the top surface of the metal layer 170 and the second precursor P2 will occur than between the monolayer at the non-activated portions (or less-activated portions) of monolayer at the sidewalls of the gate spacers 130 and the second precursor P2.

In some embodiments, the second precursor P2 reacts with most, or in some instances, all, of the activated $SiH_2$* and some of the non-activated $SiH_3$ to form silicon nitride (e.g., $SiNH_2$). For example, as shown in FIG. 6D, the entire activated $SiH_2$* at top surfaces of the hard masks 145, the top surfaces of the gate spacers 130, and the top surface of the metal layer 170 react with the second precursor P2 to form silicon nitride (e.g., $SiNH_2$). However, only partial $SiH_3$ at sidewalls of the gate spacers 130 react with the second precursor P2 to form silicon nitride (e.g., $SiNH_2$). Hence, in the illustrated example, more $SiNH_2$ is deposited on surfaces having a horizontal component than on surfaces that do not have a significant horizontal component. For example, the more $SiNH_2$ is deposited on the top surfaces of the hard masks 145, the top surfaces of the gate spacers 130, and the top surface of the metal layer 170 than on the sidewalls of the gate spacers 130. Stated another way, the $SiNH_2$ has a higher deposition rate on the top surfaces of the hard masks 145, the top surfaces of the gate spacers 130, and the top surface of the metal layer 170 than on the sidewalls of the gate spacers 130.

On the other hand, because some of the $SiH_3$ at sidewalls of the gate spacers 130 do not react with the second precursor P2, this incomplete reaction may result in an etching selectivity between portions of the silicon nitride at the top surfaces of the hard masks 145, the top surfaces of the gate spacers 130, and the top surface of the metal layer 170 and the other portions of the silicon nitride at the sidewalls of the gate spacers 130 in the following etching process (e.g., the etching process of FIG. 7). In some embodiments, the second precursor P2 can be flowed in the plasma process at a flow rate in a range from about 100 sccm to about 20000 sccm. In some embodiments, the duration of the exposure to the second precursor P2 is in a range from about 0.1 s to about 10 s. The duration of exposure to the second precursor P2 is controlled to create etching selectivity at different portions of the dielectric layer (e.g., the dielectric layer 180 of FIGS. 6A and 6E) in the following etching process (e.g., the etching process of FIG. 7). If the duration is too short (e.g., much shorter than 0.1 s), the activated $SiH_2$* at the top surfaces of the hard masks 145, the top surfaces of the gate spacers 130, and the top surface of the metal layer 170 may not completely react with the second precursor P2, and may not be able to create etching selectivity between portions of the silicon nitride at the top surfaces of the hard masks 145, the top surfaces of the gate spacers 130, and the top surface of the metal layer 170 and the other portions of the silicon nitride at the sidewalls of the gate spacers 130 in the following etching process. On the other hand, if the duration is too long (e.g., much longer than 10 s), all of the $SiH_3$ at sidewalls of the gate spacers 130 will react with the second precursor P2, and may not be able to create etching selectivity between portions of the silicon nitride at the top surfaces of the hard masks 145, the top surfaces of the gate spacers 130, and the top surface of the metal layer 170 and the other portions of the silicon nitride at the sidewalls of the gate spacers 130 in the following etching process. After exposure to the second precursor, the second precursor P2 may be purged from the tool chamber used to expose the intermediate structure to the second precursor.

The operations described in FIGS. 6B to 6D can be regarded as a deposition cycle of a PEALD process. For example, a deposition cycle of a PEALD process includes exposing the semiconductor structure 10 to the first precursor P1 (see FIG. 6B) for a first duration, and exposing the semiconductor structure 10 to the directional plasma DP (see FIG. 6C) and the second precursor P2 (see FIG. 6D) for a second duration to form a monolayer of silicon nitride on the exposed surfaces of the semiconductor structure 10. The deposition cycle of the PEALD process can be repeated any number of times, e.g., any number of cycles of the PEALD process may be implemented to form the dielectric layer 180 having desired thickness, and the resulting structure is shown in FIGS. 6A and 6E.

Reference is made to FIGS. 6A and 6E, in which FIG. 6E is an enlarged view of FIG. 6A. The dielectric layer 180 includes a plurality of horizontal portions 180H on the top surfaces of the hard masks 145, the top surfaces of the gate spacers 130, and the top surface of the metal layer 170, and a plurality of vertical portions 180V on the sidewalls of the gate spacers 130. As mentioned above, because the silicon nitride has a higher deposition rate on the top surfaces of the hard masks 145, the top surfaces of the gate spacers 130, and the top surface of the metal layer 170 than on the sidewalls of the gate spacers 130, the horizontal portions 180H of the dielectric layer 180 is thicker than the vertical portions 180V of the dielectric layer 180. For example, the horizontal portions 180H have a thickness T1, and the vertical portions 180V have a thickness T2, in which thickness T1 is greater than the thickness T2.

On the other hand, as mentioned above, the horizontal portions 180H of the dielectric layer 180 are formed in a complete reaction in a deposition cycle of a PEALD process, while vertical portions 180V of the dielectric layer 180 are formed in an incomplete reaction in a deposition cycle of a PEALD process. Accordingly, the horizontal portions 180H of the dielectric layer 180 and the vertical portions 180V of the dielectric layer 180 have etching selectivity in the etching process discussed below.

Figure 7:
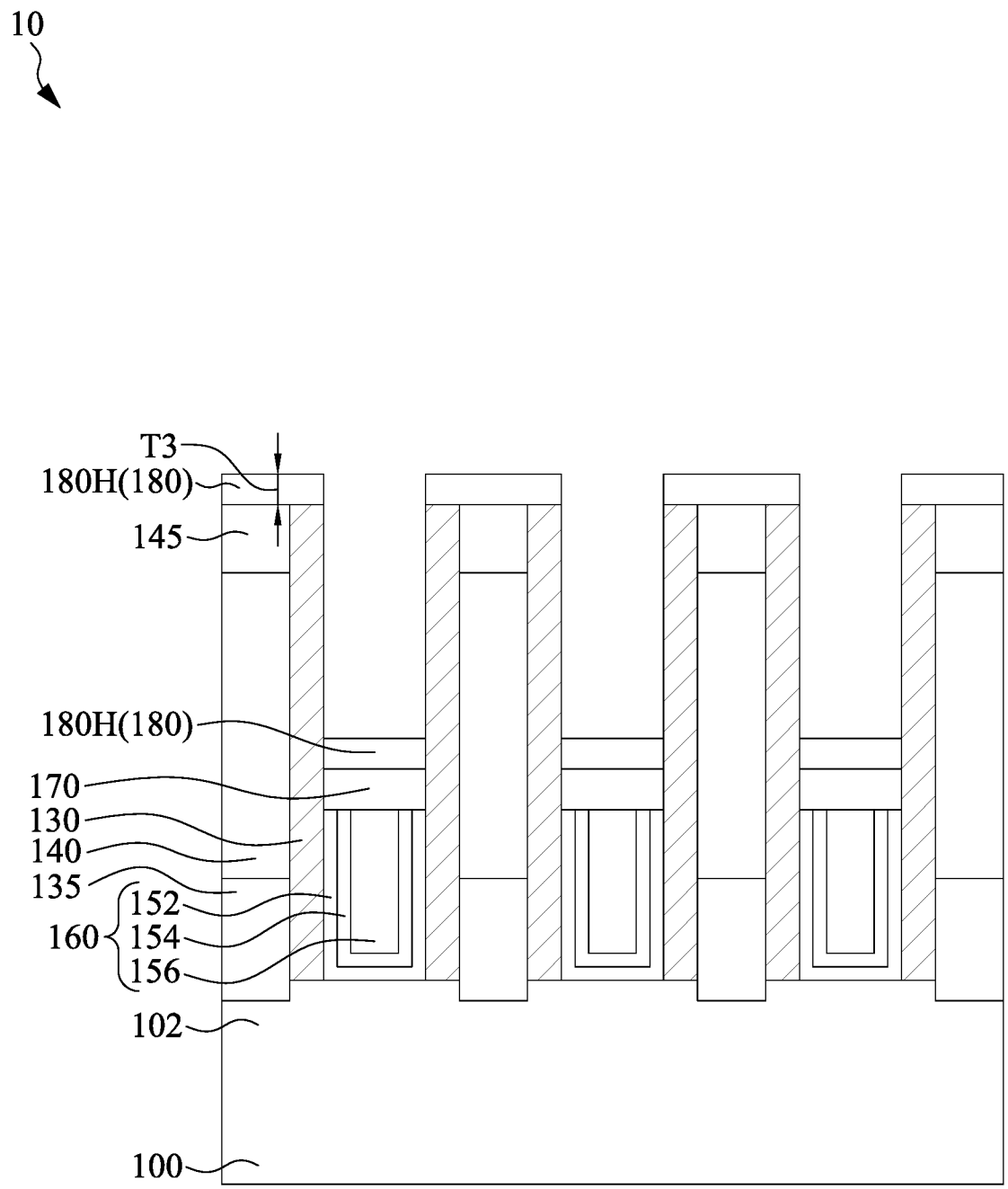

Reference is made to FIG. 7. The vertical portions 180V of the dielectric layer 180 are removed to expose sidewalls of the gate spacers 130. In some embodiments, the dielectric layer 180 may be removed using suitable etching process, such as dry etching, wet etching, or combinations thereof. For example, the etchant of the etching process may include dilute hydrofluoric acid (DHF).

As mentioned above, the horizontal portions 180H of the dielectric layer 180 and the vertical portions 180V of the dielectric layer 180 have etching selectivity. In greater detail, the horizontal portions 180H of the dielectric layer 180 have higher etching resistance to the etchant of the etching process than the vertical portions 180V of the dielectric layer 180. Accordingly, the vertical portions 180V of the dielectric layer 180 can be removed with the horizontal portions 180H of the dielectric layer 180 substantially intact. In some embodiments, the horizontal portions 180H of the dielectric layer 180 may be slightly etched during the etching process. For example, the remaining horizontal portions 180H of the dielectric layer 180 have a thickness T3, in which the thickness T3 is lower than the thickness T1 of the horizontal portions 180H of the dielectric layer 180 before the etching process (see FIG. 6E). After the etching process, the sidewalls of the gate spacers 130 are exposed to the gate trenches TR1, while the top surfaces of the hard masks 145, the top surfaces of the gate spacers 130, the top surfaces of the metal layers 170 are covered by the remaining horizontal portions 180H of the dielectric layer 180.

Figure 8:
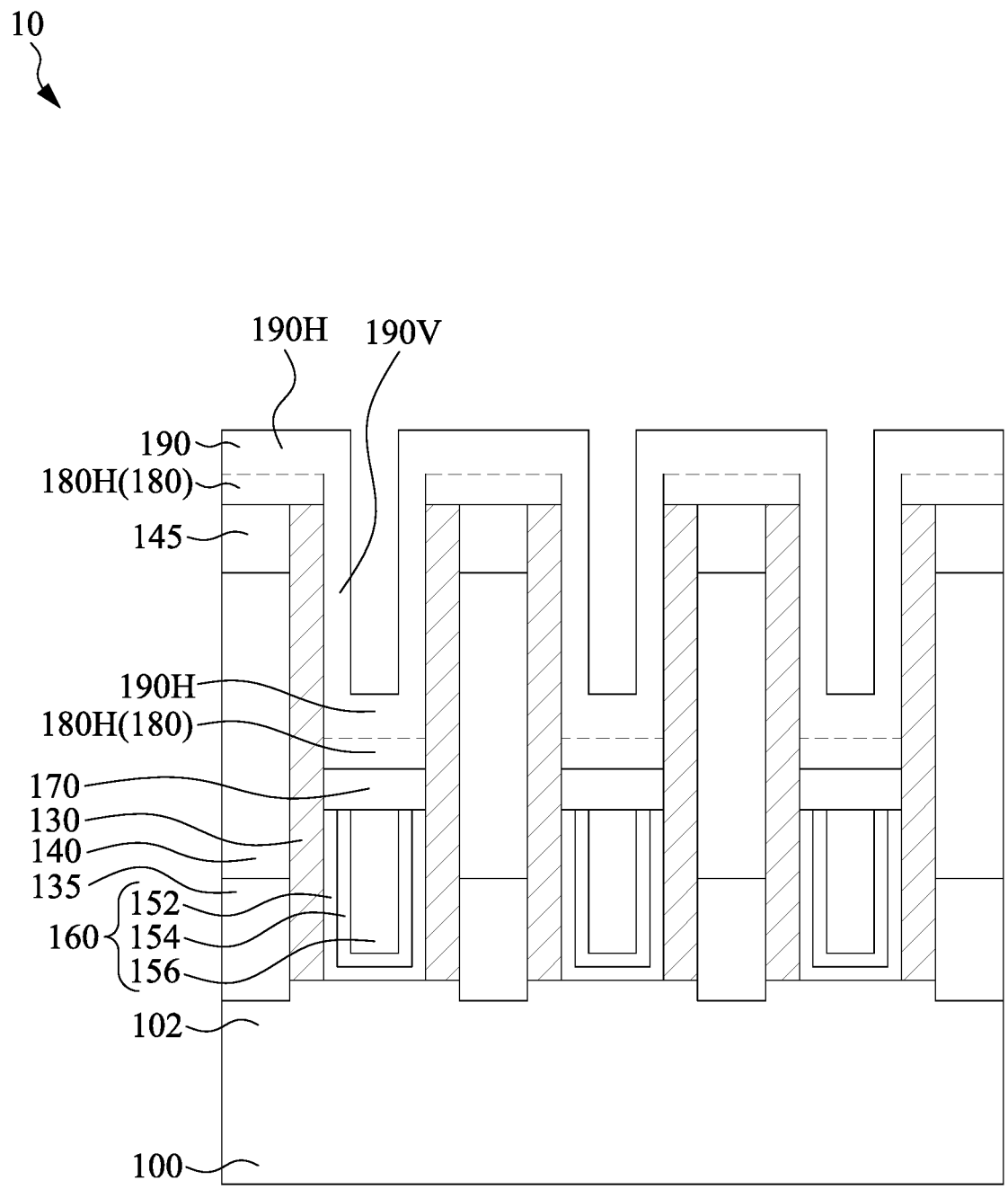

Reference is made to FIG. 8. A dielectric layer 190 is formed over the dielectric layer 180. The dielectric layer 190 has horizontal portions 190H disposed on the remaining horizontal portions 180H of the dielectric layer 180, and vertical portions 190V extending along the sidewalls of the gate spacers 130. In some embodiments, materials and formation method of dielectric layer 190 are the same or similar to those of the dielectric layer 180 with respect to the discussion of FIGS. 6A to 6E, and thus relevant details will not be repeated for brevity. For example, the horizontal portions 190H of the dielectric layer 190 may be thicker than the vertical portions 190V of the dielectric layer 190. The horizontal portions 190H of the dielectric layer 190 may include higher etching resistance to the etching process described in FIG. 9 than the vertical portions 190V of the dielectric layer 190. In some embodiments where the dielectric layers 180 and 190 are made of the same material, the dielectric layers 180 and 190 may not include distinguishable interface, and thus the interface of the dielectric layers 180 and 190 in FIG. 8 is drawn in dash-line.

Figure 9:
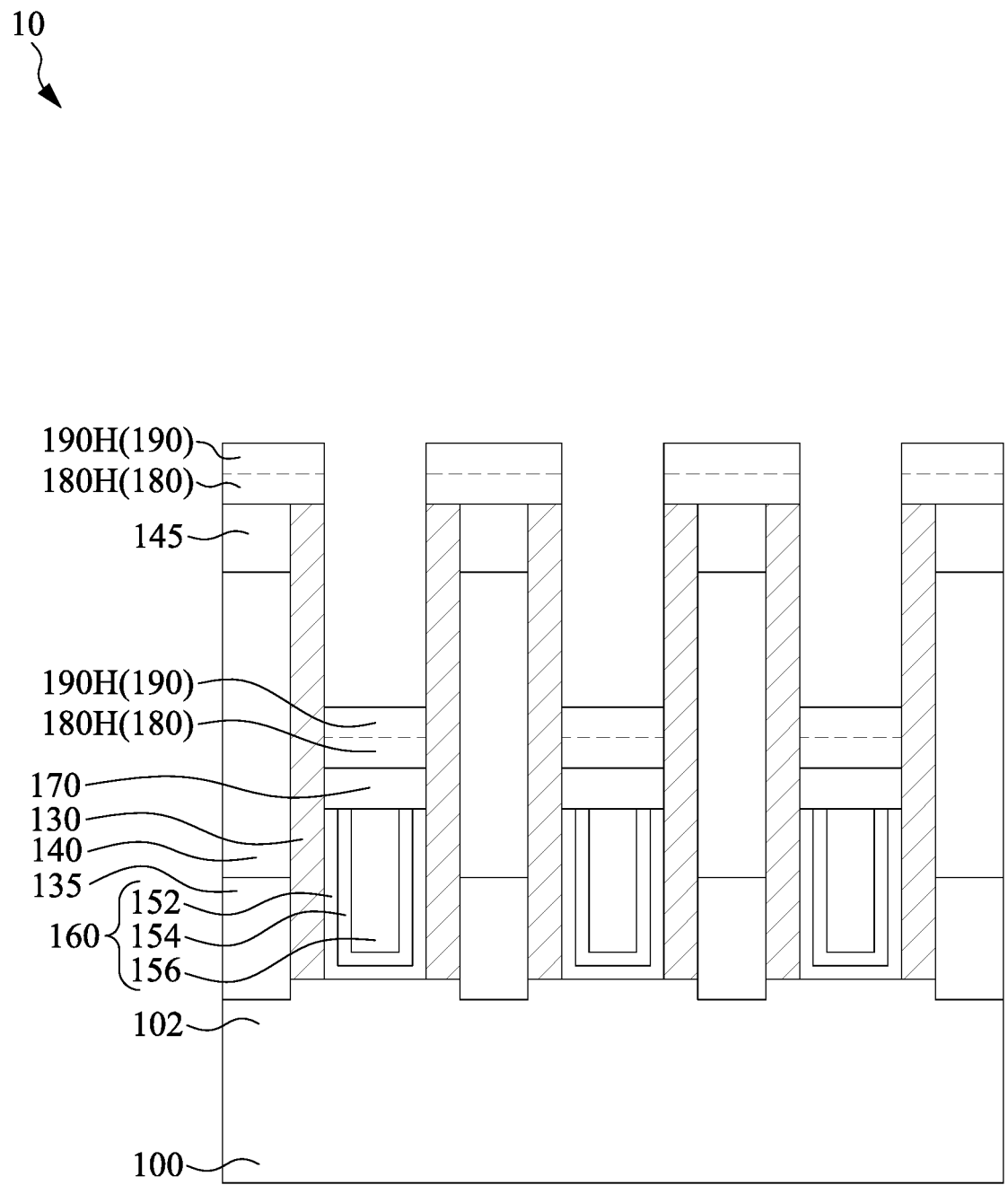

Reference is made to FIG. 9. The vertical portions 190V of the dielectric layer 190 are removed to expose sidewalls of the gate spacers 130. In some embodiments, the dielectric layer 190 may be removed using suitable etching process, such as dry etching, wet etching, or combinations thereof. For example, the etchant of the etching process may include dilute hydrofluoric acid (DHF). The etching process of FIG. 9 is similar to those described in FIG. 7, and thus relevant details will not be repeated for brevity.

The processes of FIGS. 8 and 9 can be regarded as repeating the processes of FIGS. 6A to 7. For example, a dielectric layer is deposited over the substrate 100 using the method discussed in FIGS. 6A to 6E, and vertical portions of the dielectric layer (e.g., vertical portions 180V and 190V) are selectively removed from the sidewalls of the gate spacers 130, while the horizontal portions of the dielectric layer (e.g., horizontal portions 180H and 190H).

Figure 10:
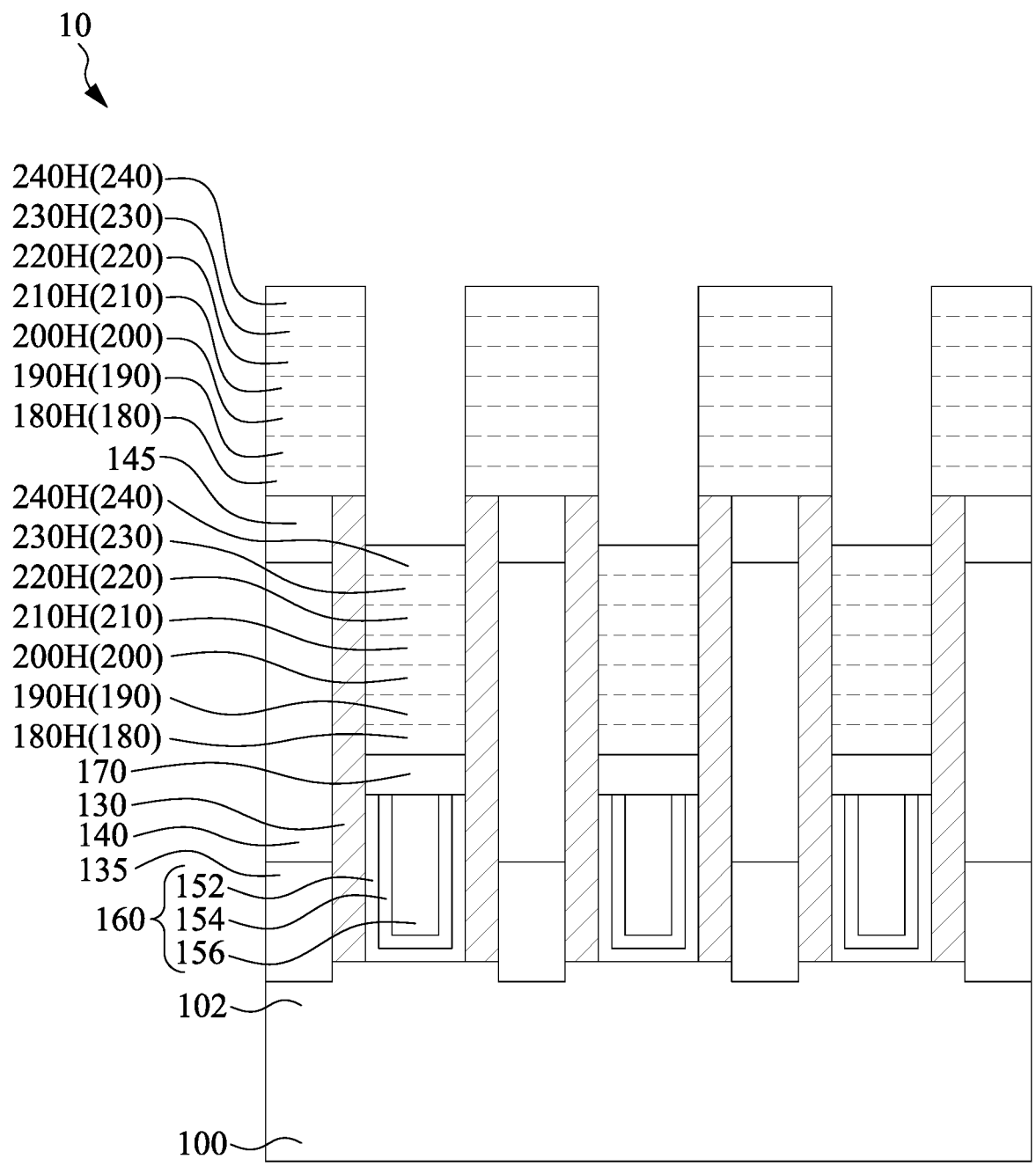

Reference is made to FIG. 10. A plurality of dielectric layers 200, 210, 220, 230, and 240 are deposited in sequence over the substrate 100. In some embodiments, materials and formation method of dielectric layers 200-240 are the same or similar to those of the dielectric layer 180 with respect to the discussion of FIGS. 6A to 7, and thus relevant details will not be repeated for brevity. For example, a dielectric layer (e.g., each of the dielectric layers 200-240) is deposited over the substrate 100, and vertical portions of the dielectric layer are removed from the sidewalls of the gate spacers 130, and horizontal portions of the dielectric layer remain on the semiconductor structure 10. As an example of FIG. 10, horizontal portions 200H, 210H, 220H, 230 H, and 240H of respective dielectric layers 200, 210, 220, 230, and 240 remain in the semiconductor structure 10 of FIG. 10.

The deposition-etch cycle can be performed plural times. That is, depositing a dielectric layer and removing vertical portions of the dielectric layer are performed in an alternate manner. In some embodiments, the deposition-etch cycle can be repeatedly performed until the topmost dielectric layer has a top surface higher than the top surface of the ILD layer 140. For example, the top surface of the dielectric layer 240 is higher than the top surface of the ILD layer 140. In some embodiments, the top surface of the dielectric layer 240 is higher than the bottom surfaces of the hard masks 145 and lower than the top surfaces of the hard masks 145. This allows the remaining portions of the dielectric layers 180-240 are free of seams, which will facilitate the metal vias formation process discussed below. In the example of FIG. 10, 7 times of the deposition-etch cycle are performed, and thus seven layers are formed (e.g., dielectric layers 180-240). In some embodiments, the deposition-etch cycle may be performed 6 times to 10 times.

In some embodiments of the present disclosure, plural dielectric layers (e.g., dielectric layers 180-240) are deposited in a gate trench between gate spacers. Each of the dielectric layers are formed by, for example, depositing a dielectric material in the gate trenches using a PEALD process to create etching selectivity between horizontal portions and vertical portions of the dielectric layer, and followed by an etching process to remove the vertical portions of the dielectric layer. This deposition-etch cycle is repeatedly performed to form the dielectric layers, layer by layer, in the gate trench with a bottom-up manner. Accordingly, the dielectric layers can be formed in the gate trench without seams or voids, which will facilitate the metal vias formation process discussed below.

Figure 11:
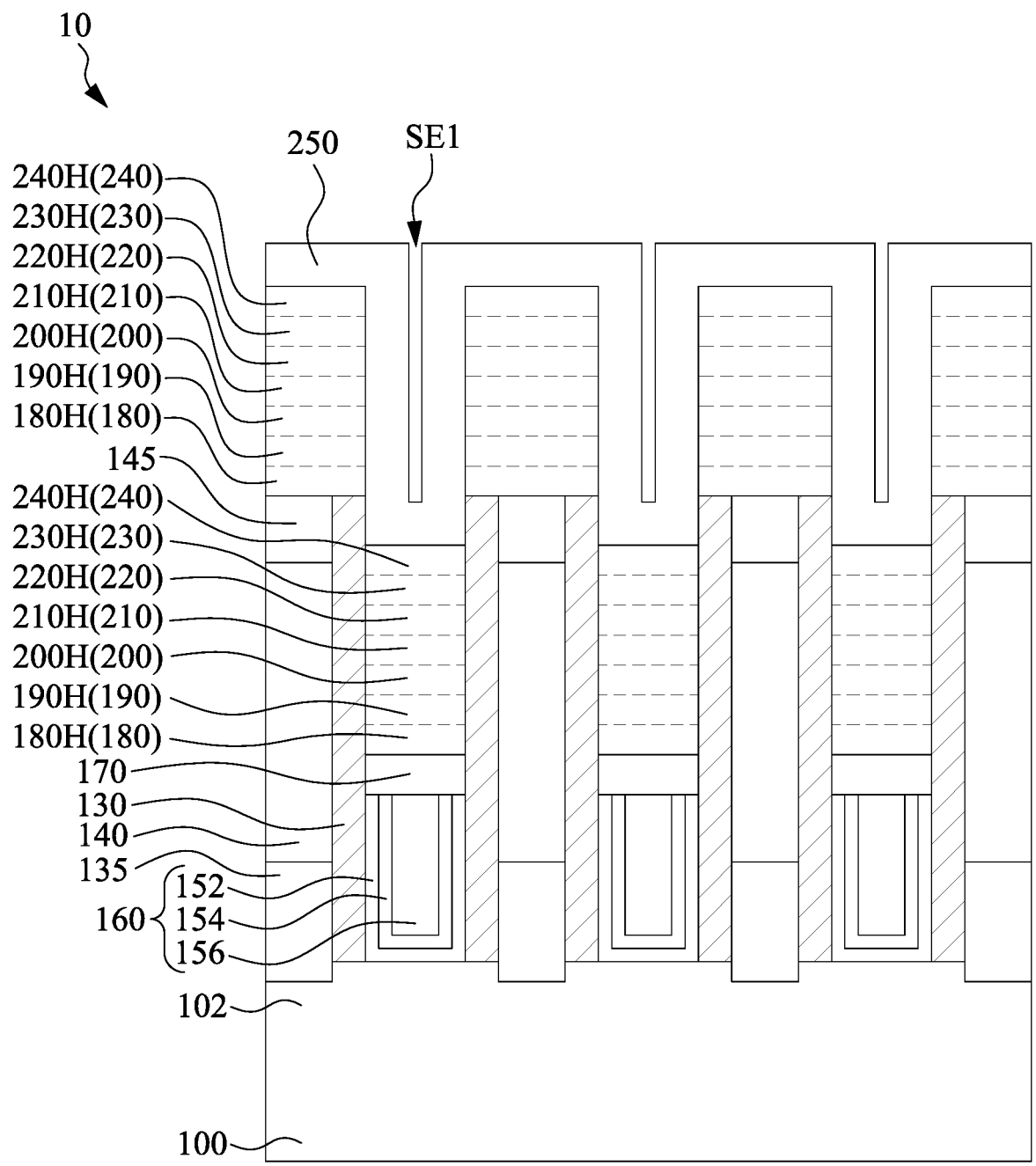

Reference is made to FIG. 11. A dielectric layer 250 is formed over the dielectric layer 240. In some embodiments, the dielectric layer 250 is formed to line the dielectric layers 180 to 240 and the gate spacers 130. The dielectric layer 250 is in contact with the gate spacers 130. In some embodiments, the bottommost surface of the dielectric layer 250 is higher than the top surface of the ILD layer 140, and is lower than the top surfaces of the hard masks 145. Each of the dielectric layers 180-240 has first portions over the metal layers 170, and second portions over the hard masks 145 and the gate spacers 130. In some embodiments, the dielectric layer 250 extends along from the sidewalls of the second portions of the dielectric layers 180-240 to the sidewalls of the gate spacers 130. In some embodiments, seams SE1 are formed in the dielectric layer 250, in which each of the seams SE1 corresponds to a metal gate structure 160. In some embodiments, the bottom end of the each of the seams SE1 is higher than the top surface of the ILD layer 140.

The material of the dielectric layer 250 is similar to that of the dielectric layer 180 as described in FIGS. 6A to 6E. However, the formation method of the dielectric layer 250 is different from that of the dielectric layer 180 described in FIGS. 6A to 6E. In some embodiments, the dielectric layer 250 is formed by a PEALD process. In the PEALD process for forming the dielectric layer 250, a deposition cycle of the PEALD process includes exposing the semiconductor structure 10 to a first precursor P1 (e.g., dichlorosilane $SiH_2Cl$ (DCS)) for a third duration, and exposing the semiconductor structure 10 to the directional plasma DP and the second precursor P2 (e.g., ammonia ($NH_3$) plasma and/or nitrogen ($N_2$) plasma) for a fourth duration to form a monolayer of silicon nitride on the exposed surfaces of the semiconductor structure 10. The deposition cycle of the PEALD process can be repeated any number of times, e.g., any number of cycles of the PEALD process may be implemented to form the dielectric layer 250 having desired thickness.

In some embodiments, the fourth duration of exposing the semiconductor structure 10 to the directional plasma DP and the second precursor P2 for forming the dielectric layer 250 of FIG. 11 is longer than the second duration of exposing the semiconductor structure 10 to the directional plasma DP and the second precursor P2 for forming the dielectric layer 180 of FIG. 6A. The longer fourth duration ensures that the SiH$_3$ monolayer on the vertical portions of the dielectric layer 250 of FIG. 11 can fully react with the second precursor P2 to form silicon nitride. In some embodiments during the dielectric layer 250 of FIG. 11 is formed, the second precursor P2 can be flowed in the plasma process at a flow rate in a range from about 100 sccm to about 10000 sccm. In some embodiments, the duration of the exposure to the second precursor P2 is in a range from about 1 s to about 10 s. In some embodiments, the third duration of exposing the semiconductor structure 10 to the first precursor P1 for forming the dielectric layer 250 of FIG. 11 is substantially the same as the first duration of exposing the semiconductor structure 10 to the first precursor P1 for forming the dielectric layer 180 of FIG. 6A.

Figure 12:
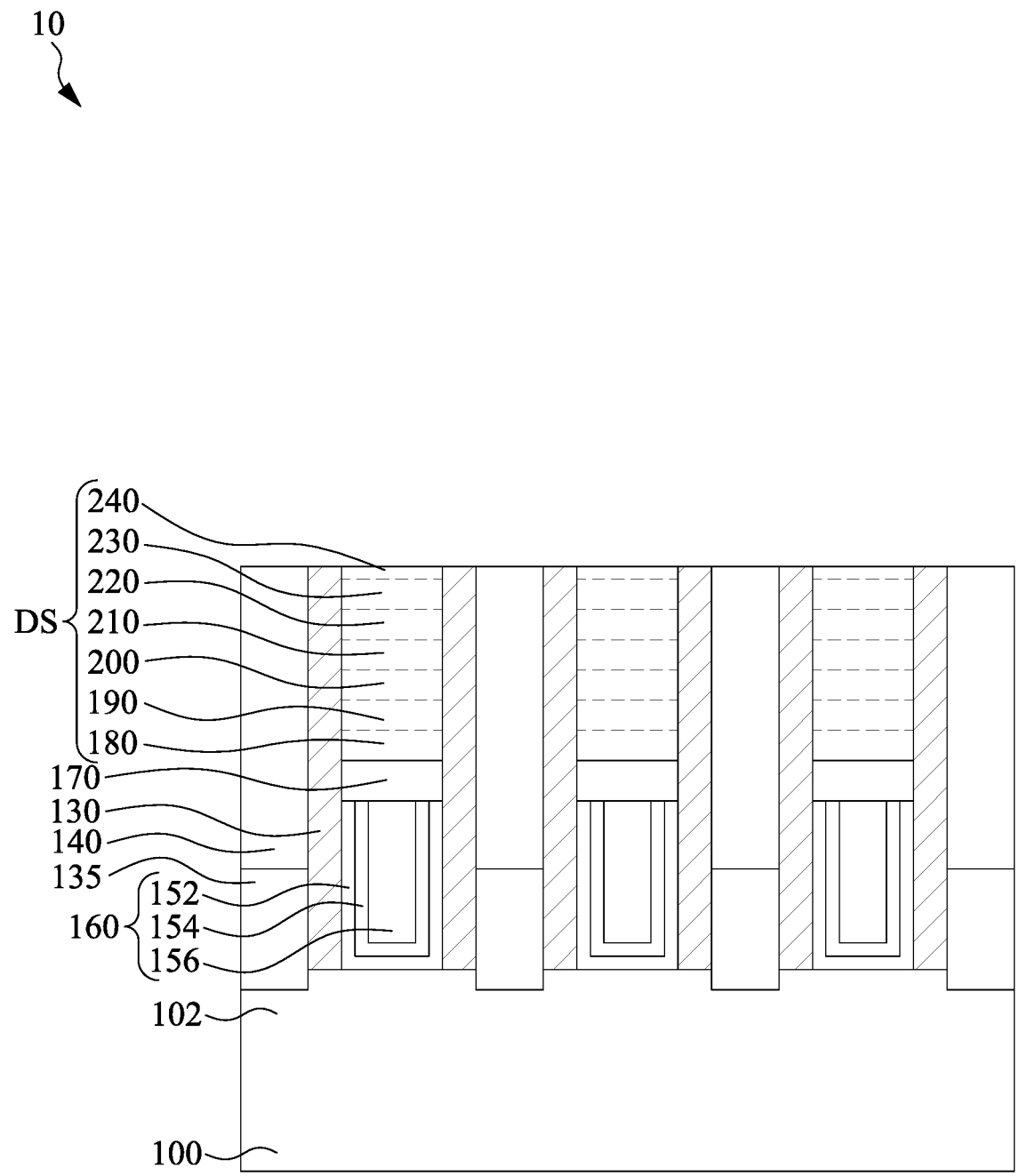

Reference is made to FIG. 12. A CMP process is performed to remove excessive dielectric layers 180 to 250 until the ILD layer 140 is exposed. In some embodiments, an entirety of the dielectric layer 250 is removed. That is, the seams SE1 of the dielectric layer 250 are removed from the semiconductor structure 10. Accordingly, the remaining dielectric layers 180 to 240 in each gate trench TR1 are collectively referred to dielectric structure DS in the following discussion, in which the dielectric structures DS are free of seam. After the CMP process, the top surface of the dielectric structure DS is substantially level with the top surface of the ILD layer 140. As discussed above with respect to FIG. 10, the deposition-etching cycle is repeatedly performed until the top surface of the topmost dielectric layer (e.g., dielectric layer 240 in this embodiment) is higher than the top surface of the ILD layer 140. This can ensure that, after the CMP process of FIG. 12, the remaining dielectric layers 180 to 240 (dielectric structure DS) is a seam-free structure.

Figure 13:
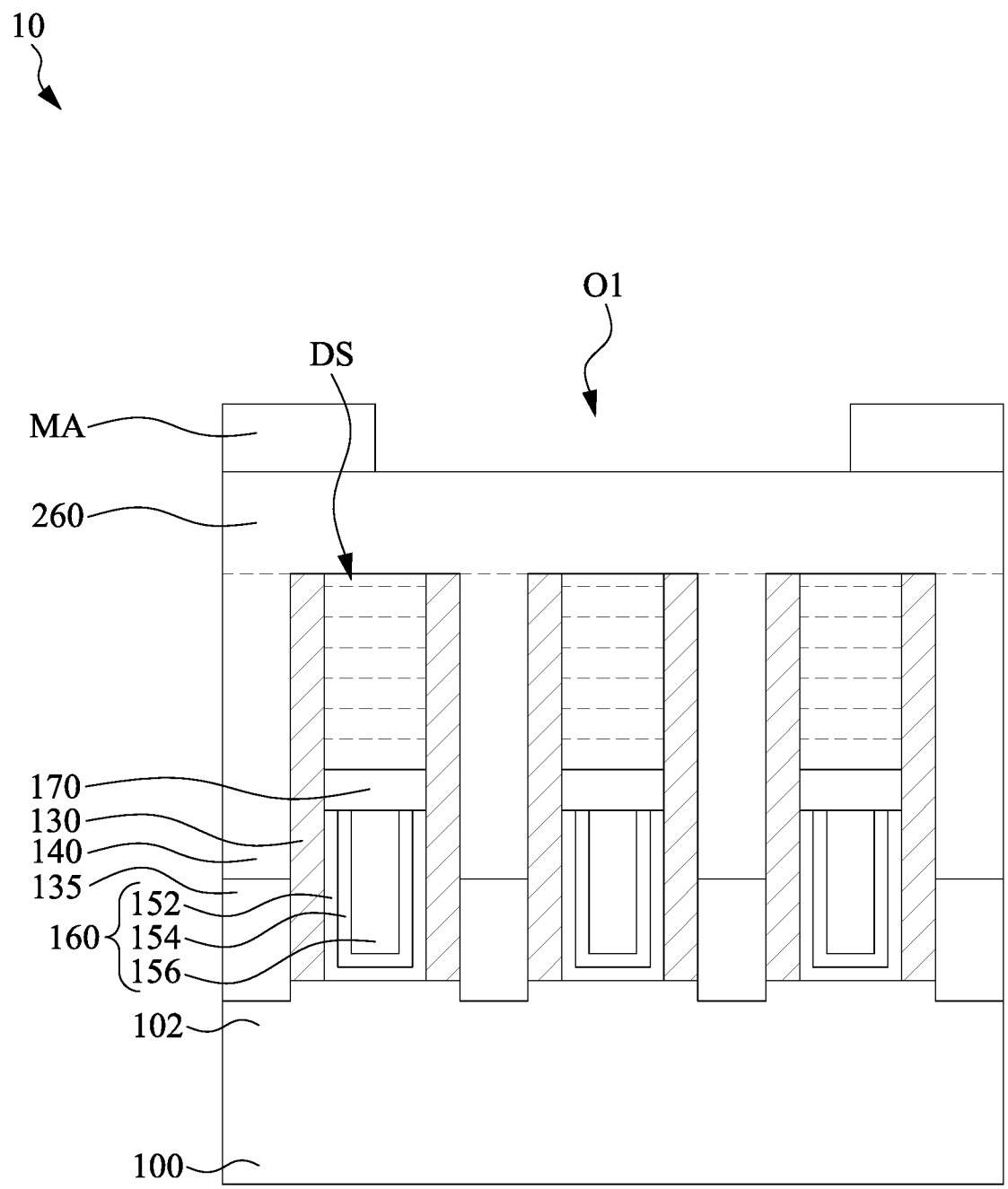

Reference is made to FIG. 13. An interlayer dielectric (ILD) layer 260 and a patterned mask MA are formed over the ILD layer 140 and the dielectric structure DS. In some embodiments, the ILD layer 260 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 260 may be formed using, for example, CVD, ALD, spin-on-glass (SOG) or other suitable techniques. In some embodiments, the ILD layers 140 and 260 may be made of the same material, and thus the ILD layers 140 and 260 may not include a distinguishable interface therebetween. In some embodiments, the patterned mask MA includes an opening O1. The patterned mask MA may be made of photoresist, and may be patterned using suitable process, such as photolithography process.

Figure 14:
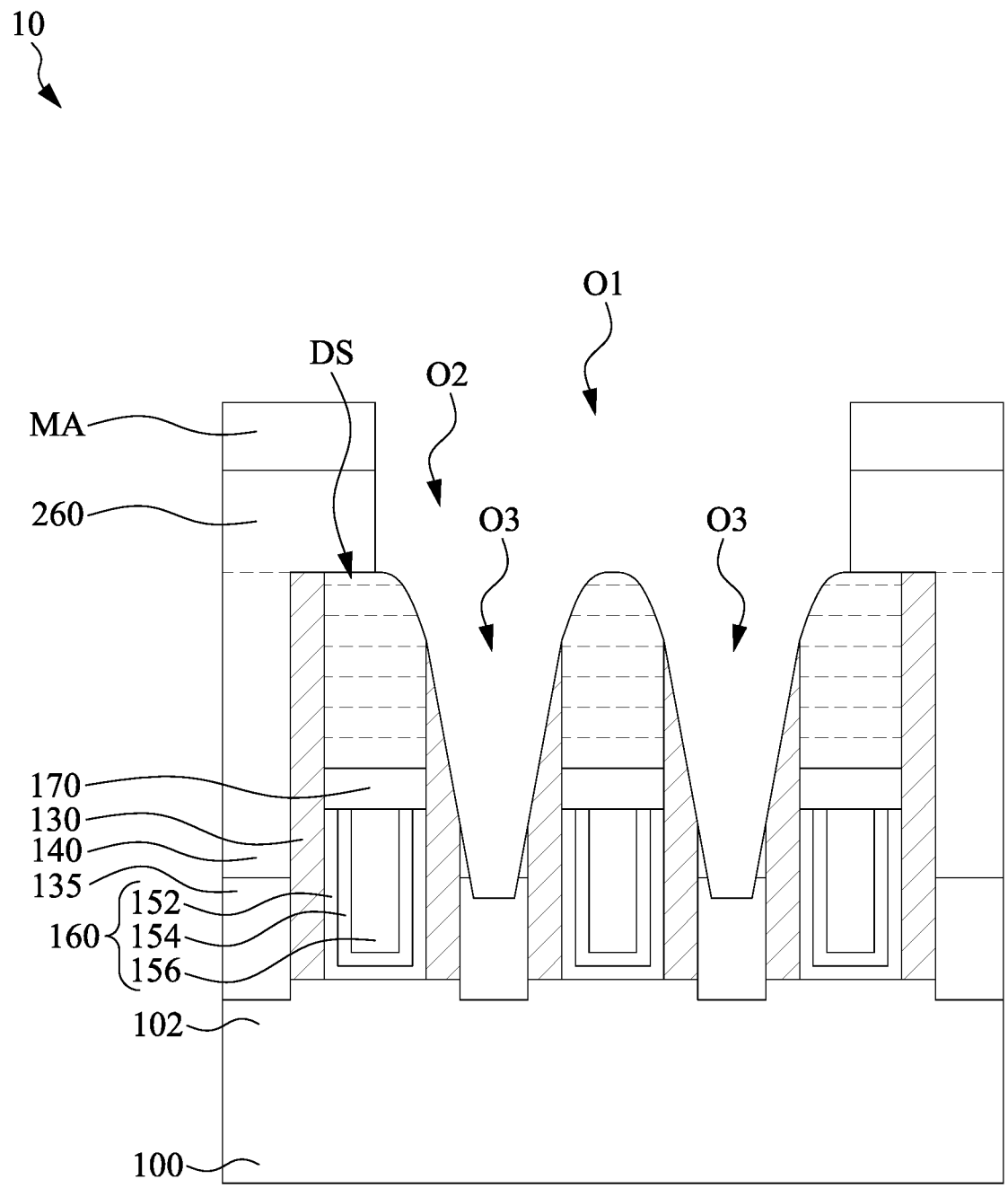

Reference is made to FIG. 14. The ILD layers 260 and 140 are etched through the patterned mask MA to form source/drain contact openings O3 between the gate spacers 130. In some embodiments, an opening O2 is formed in the ILD layer 260, and the source/drain contact openings O3 are connected to the opening O2. In some embodiments, the dielectric structures DS and the gate spacers 130 have higher etching resistance to the etching process than the ILD layers 260 and 140. However, the dielectric structures DS and the gate spacers 130 may also be etched during the etching process. As a result, each of the exposed gate spacers 130 has a tapered profile, which results in that the each source/drain contact opening O3 between two exposed gate spacers 130 has a tapered profile. Stated another way, the width of the exposed gate spacers 130 decreases as a distance from the substrate 100 increases, and the width of the source/drain contact opening O3 increases as a distance from the substrate 100 increases. In some embodiments, the etched gate spacers 130 have a topmost position lower than a topmost position of the dielectric structure DS.

Figure 15:
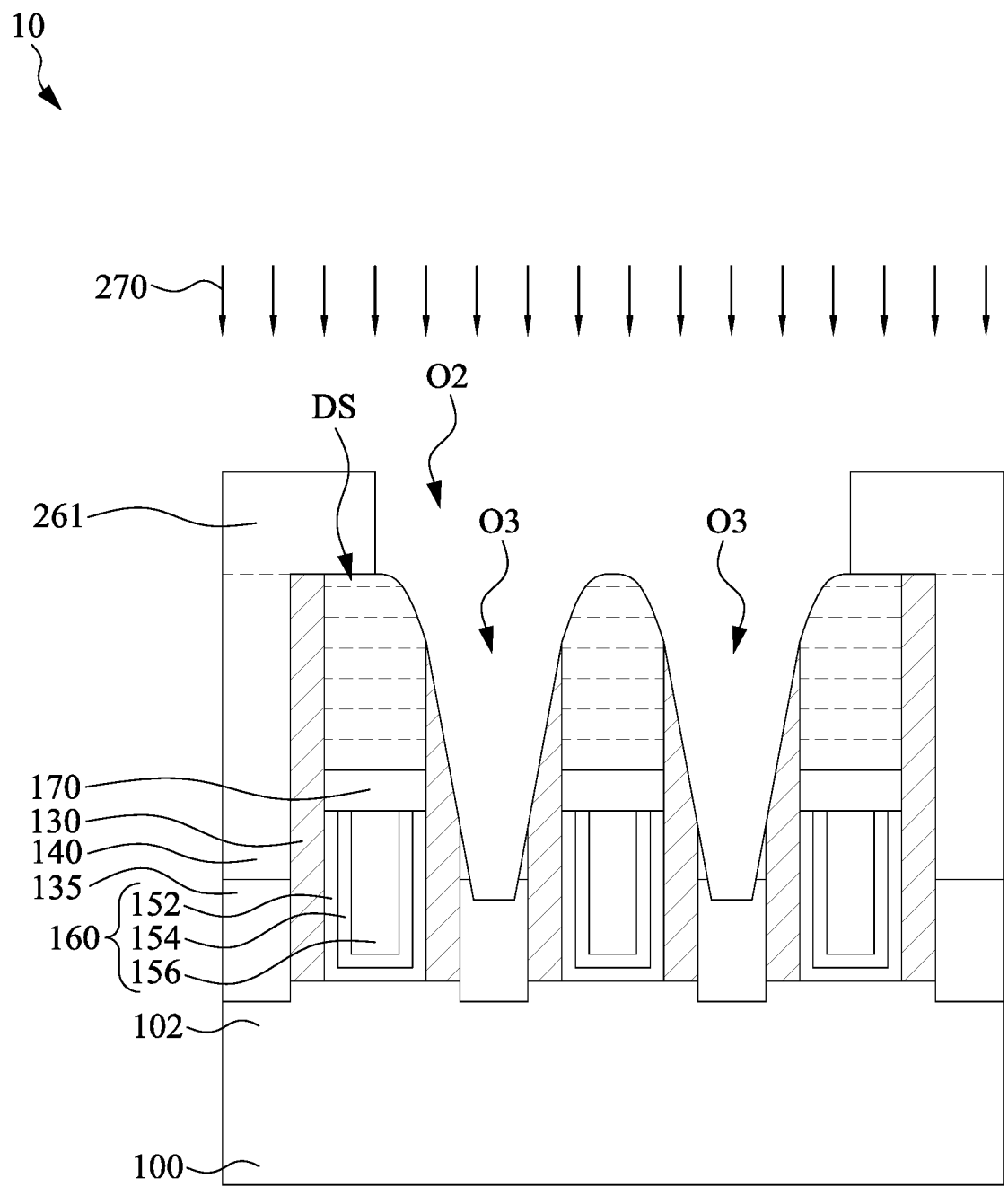

Reference is made to FIG. 15. The patterned mask MA is removed, and a pre-clean process 270 is performed to the source/drain structures 135. After the formation of the source/drain contact openings O3, the pre-clean process 270 is performed to remove native oxide (e.g., SiO$_2$) from the surfaces of the exposed source/drain structures 135 that may be formed due to exposure to various etchants during formation of the source/drain contact openings O3. Example of pre-clean process 270 may include a wet cleaning using a dilute HF aqueous solution or a dry cleaning using a plasma (e.g., a NF$_3$/NH$_3$ plasma), or a combination of both.

In some embodiments of the present disclosure, the dielectric structure DS is formed with a seam-free structure by repeatedly performing the deposition-etch cycle as discussed in FIGS. 6A to 10. However, if the dielectric structure DS is formed by depositing several dielectric layers without etching vertical portions of the dielectric layers, seams may be formed in the resulting dielectric structure DS. While during the pre-clean process of FIG. 15, the seams may be exposed to the pre-clean process 270, and the etchants of the pre-clean process 270 may etch the dielectric structure DS through the seams and further enlarge the seams. Accordingly, a conductive material may filled into the enlarged seams during the following contact formation process (e.g., FIGS. 16 to 17). Such portions of the conductive material filled in the seams may cause an unwanted etch stop during the following gate contact opening formation process (e.g., FIGS. 18 to 19), which will deteriorate the quality of the gate contact opening (e.g., gate contact opening O4 of FIG. 18). On the other hand, because the present disclosure provides a seam-free dielectric structure DS over the metal gate structures 160, the gate contact opening may be formed without unwanted etch stop, and the device performance may be improved.

Figure 16:
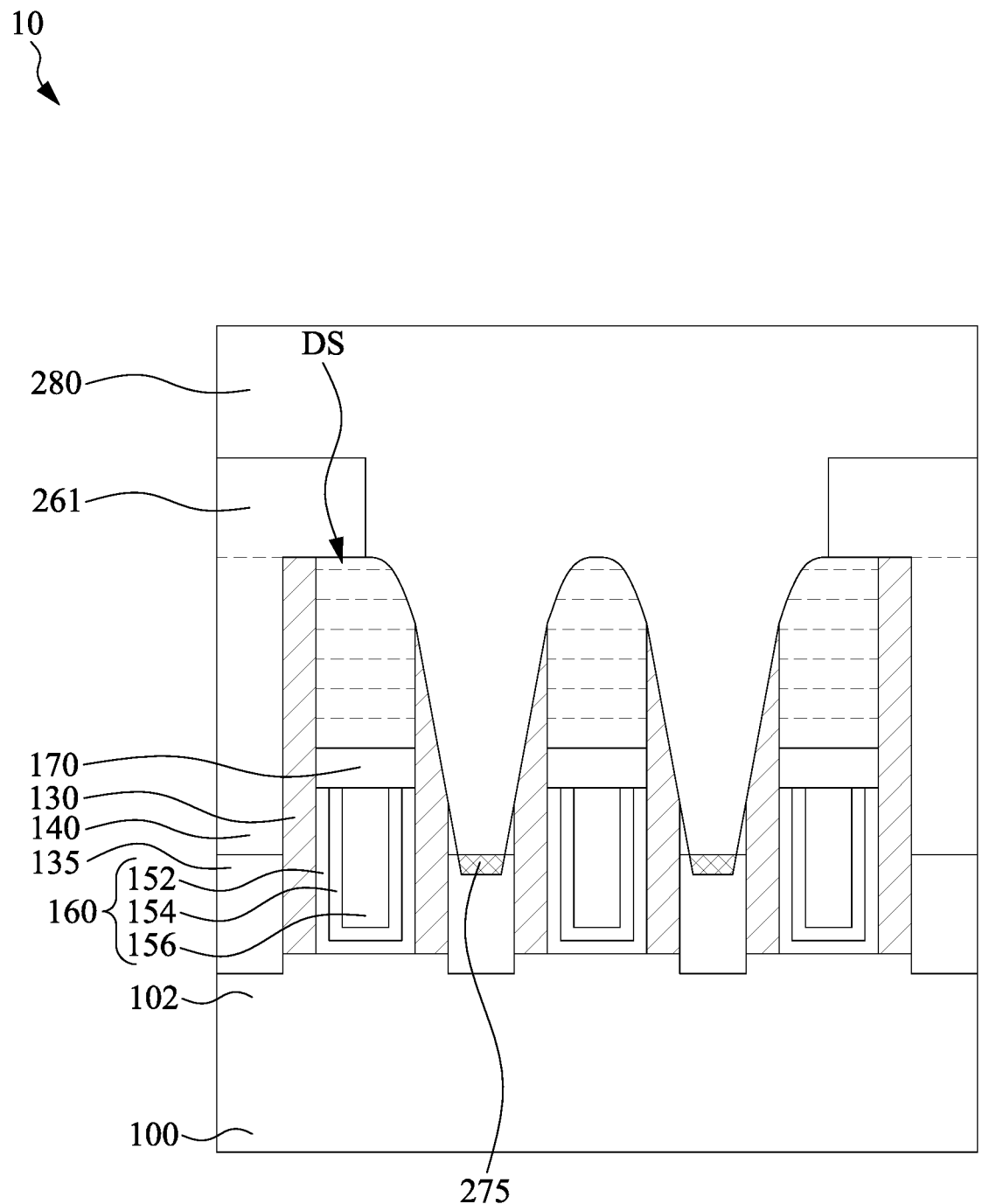

Reference is made to FIG. 16. Silicide layers 275 are formed over the source/drain structures 135, and a conductive material 280 is deposited in the source/drain contact openings O3. In some embodiments, the silicide layers 275 may include titanium silicide (TiSi), nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In some embodiments, the conductive material may include Ti, W, Co, Cu, Al, Mo, MoW, W, TiN, TaN, WN, combinations thereof, or other suitable conductive material. Thus, in some cases, the conductive material may include a plurality of layers.

Figure 17:
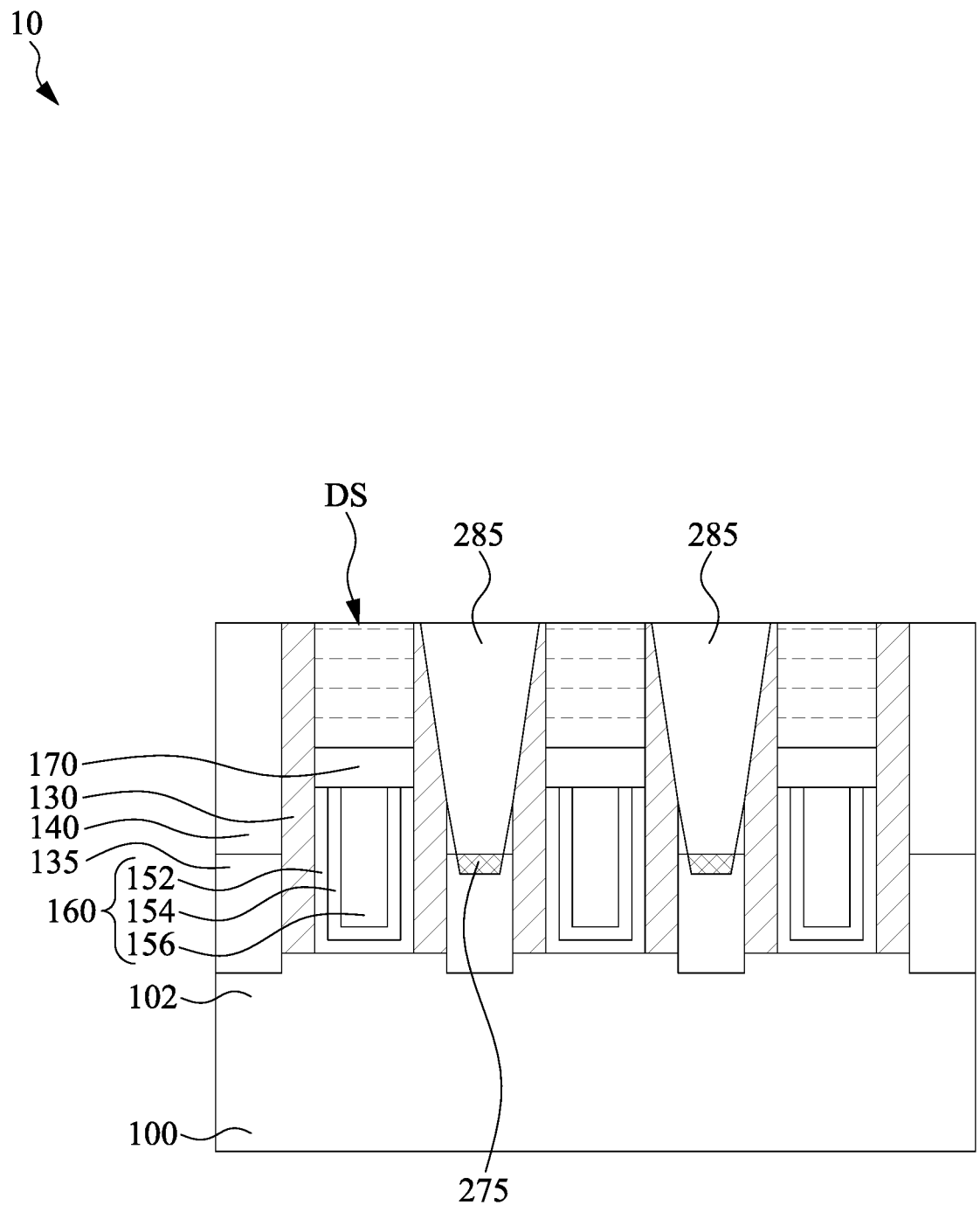

Reference is made to FIG. 17. A CMP process is performed to remove excessive conductive material 280 until the top surface of the ILD layer 140 is exposed. After the CMP process, the remaining portions of the conductive material 280 in the respective source/drain openings O3 are referred to as source/drain contacts 282.

Figure 18:
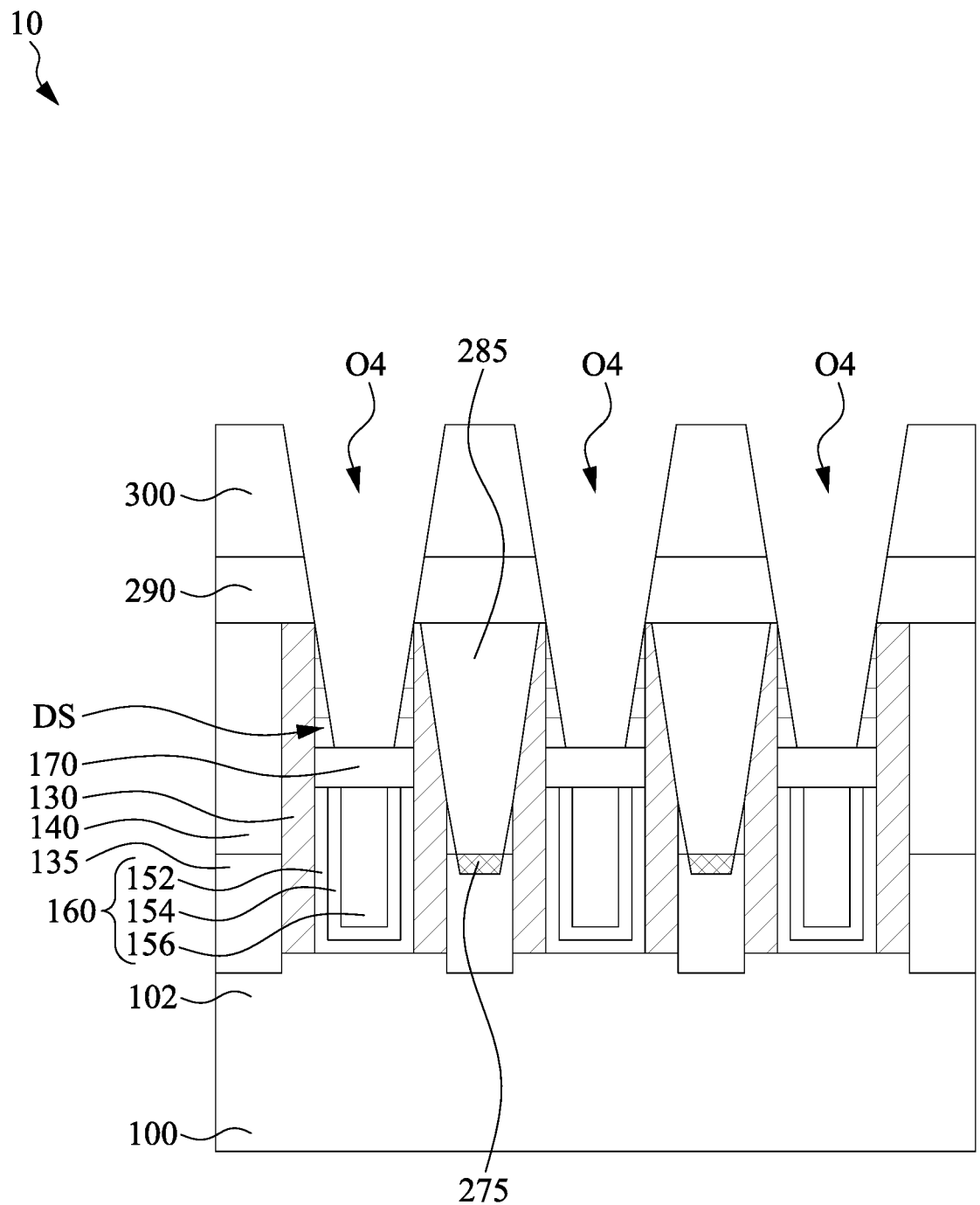

Reference is made to FIG. 18. A contact etch stop layer (CESL) 290 and an interlayer dielectric (ILD) layer 300 are formed over the ILD layer 140 and the source/drain contacts 282, and gate contact openings O4 are formed in the ILD layer 300, the CESL 290, and the dielectric structures DS. The gate contact openings O4 expose the respective metal layers 170. In some embodiments, the gate contact openings O4 may be formed by, for example, forming a patterned mask (not shown) defining the positions of the gate contact openings O4 over the ILD layer 300, followed by an etching process to remove portions of the ILD layer 300, the CESL 290, and the dielectric structures DS. After the etching process, the patterned mask may be removed.

In some embodiments, the CESL 290 includes SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN. In some embodiments, the ILD layer 260 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 260 may be formed using, for example, CVD, ALD, spin-on-glass (SOG) or other suitable techniques.

Figure 19:
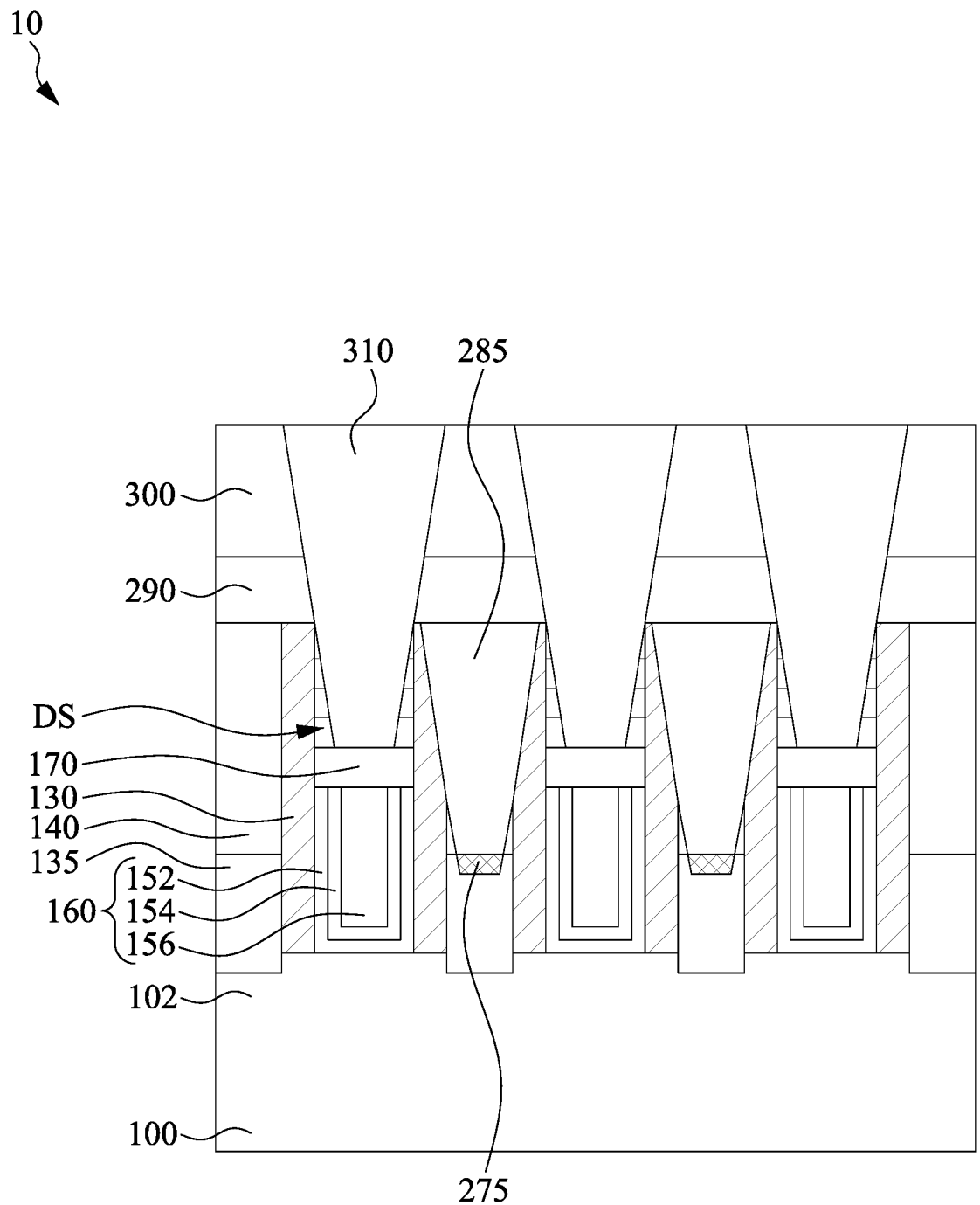

Reference is made to FIG. 19. Gate contacts 310 are formed in the gate contact openings O4, respectively. In some embodiments, the gate contacts 310 can be formed by, for example, depositing a conductive material in the gate contact openings O4 and over the ILD layer 300, followed by a CMP process to remove excessive conductive material until top surface of the ILD layer 300 is exposed. In some embodiments, the gate contacts 310 may include Ti, W, Co, Cu, Al, Mo, MoW, W, TiN, TaN, WN, combinations thereof, or other suitable conductive material. Thus, in some cases, the conductive material may include a plurality of layers.

Figure 20A:
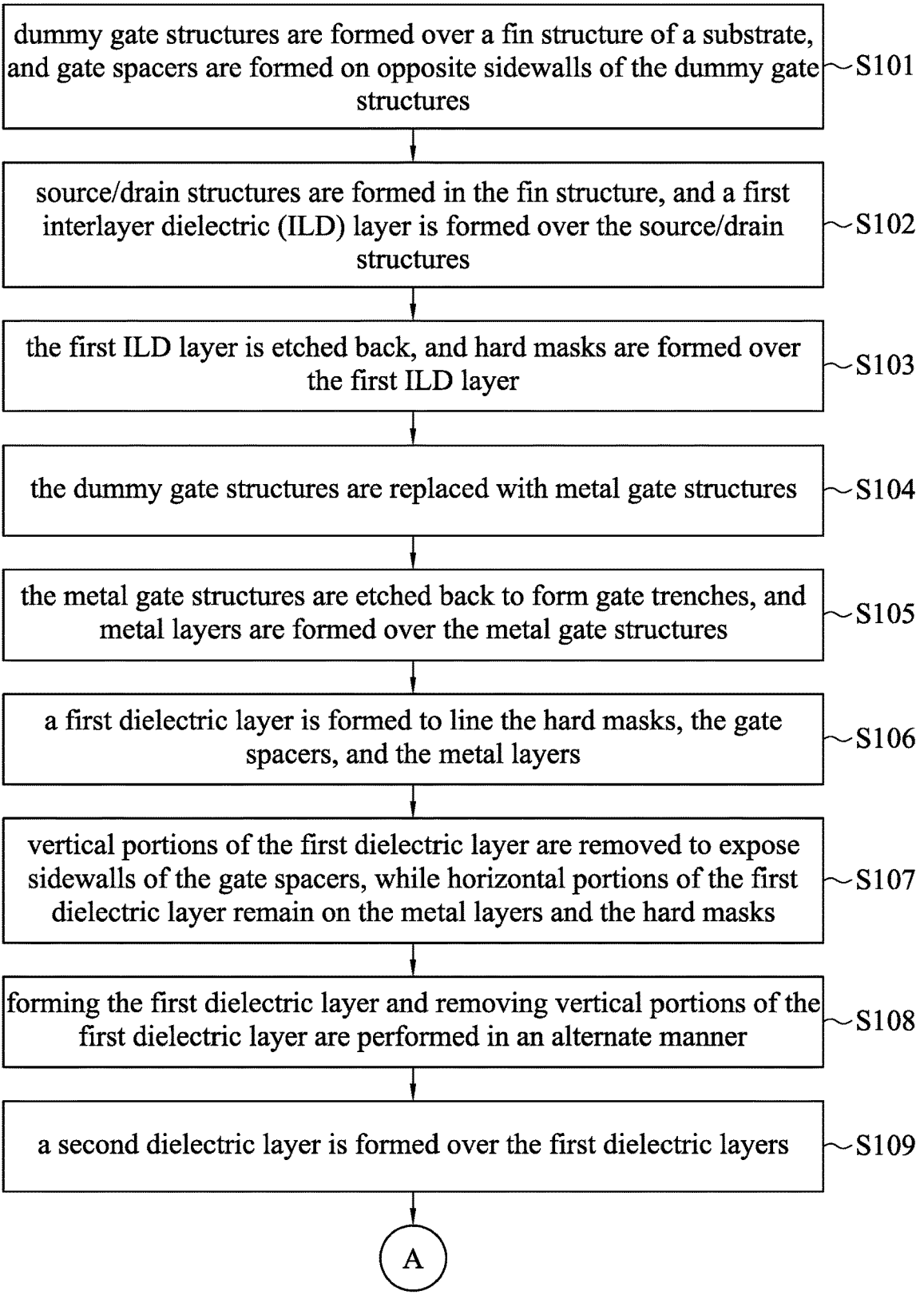
FIGS. 20A and 20B illustrate a method of forming a semiconductor device in accordance with some embodiments of the present disclosure.
Figure 20B:
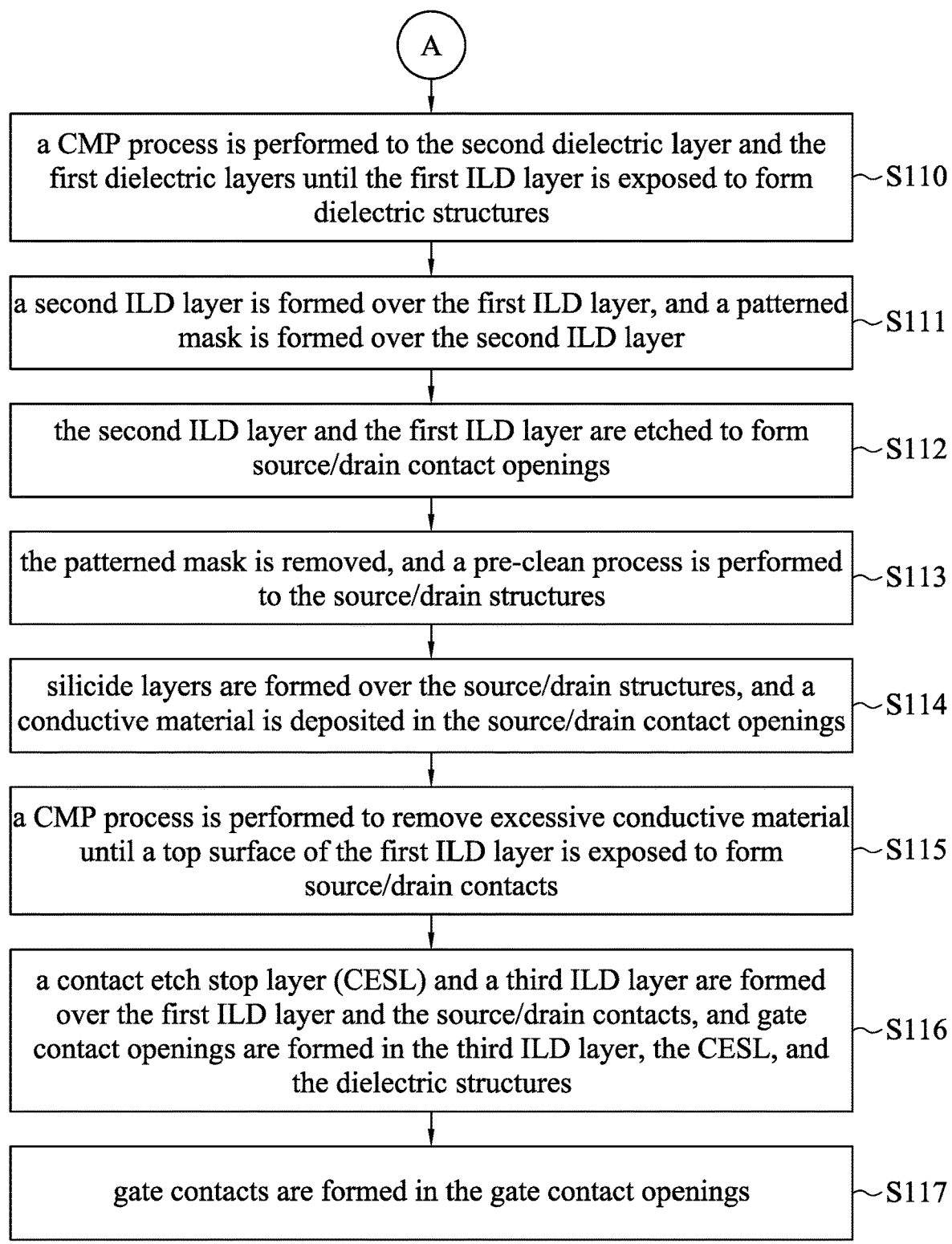

FIGS. 20A and 20B illustrate a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, dummy gate structures are formed over a fin structure of a substrate, and gate spacers are formed on opposite sidewalls of the dummy gate structures. FIG. 1 illustrates a cross-sectional view of some embodiments corresponding to act in block S101.

At block S102, source/drain structures are formed in the fin structure, and a first interlayer dielectric (ILD) layer is formed over the source/drain structures. FIG. 2 illustrates a cross-sectional view of some embodiments corresponding to act in block S102.

At block S103, the first ILD layer is etched back, and hard masks are formed over the first ILD layer. FIG. 3 illustrates a cross-sectional view of some embodiments corresponding to act in block S103.

At block S104, the dummy gate structures are replaced with metal gate structures. FIG. 4 illustrates a cross-sectional view of some embodiments corresponding to act in block S104.

At block S105, the metal gate structures are etched back to form gate trenches, and metal layers are formed over the metal gate structures. FIG. 5 illustrates a cross-sectional view of some embodiments corresponding to act in block S105.

At block S106, a first dielectric layer is formed to line the hard masks, the gate spacers, and the metal layers. FIGS. 6A to 6E illustrate cross-sectional views of some embodiments corresponding to act in block S106.

At block S107, vertical portions of the first dielectric layer are removed to expose sidewalls of the gate spacers, while horizontal portions of the first dielectric layer remain on the metal layers and the hard masks. FIG. 7 illustrates a cross-sectional view of some embodiments corresponding to act in block S107.

At block S108, forming the first dielectric layer and removing vertical portions of the first dielectric layer are performed in an alternate manner. FIGS. 8 to 10 illustrate cross-sectional views of some embodiments corresponding to act in block S108.

At block S109, a second dielectric layer is formed over the first dielectric layers. FIG. 11 illustrates a cross-sectional view of some embodiments corresponding to act in block S109.

At block S110, a CMP process is performed to the second dielectric layer and the first dielectric layers until the first ILD layer is exposed to form dielectric structures. FIG. 12 illustrates a cross-sectional view of some embodiments corresponding to act in block S110.

At block S111, a second ILD layer is formed over the first ILD layer, and a patterned mask is formed over the second ILD layer. FIG. 13 illustrates a cross-sectional view of some embodiments corresponding to act in block S111.

At block S112, the second ILD layer and the first ILD layer are etched to form source/drain contact openings. FIG. 14 illustrates a cross-sectional view of some embodiments corresponding to act in block S112.

At block S113, the patterned mask is removed, and a pre-clean process is performed to the source/drain structures. FIG. 15 illustrates a cross-sectional view of some embodiments corresponding to act in block S113.

At block S114, silicide layers are formed over the source/drain structures, and a conductive material is deposited in the source/drain contact openings. FIG. 16 illustrates a cross-sectional view of some embodiments corresponding to act in block S114.

At block S115, a CMP process is performed to remove excessive conductive material until a top surface of the first ILD layer is exposed to form source/drain contacts. FIG. 17 illustrates a cross-sectional view of some embodiments corresponding to act in block S115.

At block S116, a contact etch stop layer (CESL) and a third ILD layer are formed over the first ILD layer and the source/drain contacts, and gate contact openings are formed in the third ILD layer, the CESL, and the dielectric structures. FIG. 18 illustrates a cross-sectional view of some embodiments corresponding to act in block S116.

At block S117, gate contacts are formed in the gate contact openings. FIG. 19 illustrates a cross-sectional view of some embodiments corresponding to act in block S117.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that, a method including alternately performing depositing a dielectric layer and removing vertical portions of the dielectric layer is utilized to form a seam-free dielectric structure over a metal gate structure, which in turn will facilitate a following metal vias formation process. Accordingly, the device performance can be improved.

In some embodiments of the present disclosure, a method includes forming a dummy gate structure over a substrate; forming a plurality of gate spacers on opposite sidewalls of the dummy gate structure; forming an interlayer dielectric (ILD) layer surrounding the gate spacers; replacing the dummy gate structure with a metal gate structure; etching back the metal gate structure to form a gate trench between the gate spacers; depositing a first dielectric layer in the gate trench, in which the first dielectric layer has horizontal portions over the metal gate structure and the ILD layer, and vertical portions on sidewalls of the gate spacers; etching the vertical portions of the first dielectric layer until the sidewalls of the gate spacers exposed; and performing depositing the first dielectric layer and etching the vertical portions of the first dielectric layer in an alternate manner.

In some embodiments of the present disclosure, a method includes etching back a metal gate structure to form a gate trench between gate spacers on opposite sidewalls of the metal gate structure; forming a first dielectric layer in the gate trench by a first PEALD process, in which a deposition cycle of the first PEALD process includes exposing the gate trench to a first precursor for a first duration; providing a directional plasma into the gate trench; and exposing the gate trench to a second precursor for a second duration; removing vertical portions of the first dielectric layer to expose sidewalls of the gate spacers; and forming a second dielectric layer in the gate trench by a second PEALD process, in which a deposition cycle of the second PEALD process includes exposing the gate trench to the first precursor for a third duration; providing the directional plasma into the gate trench; and exposing the gate trench to the second precursor for a fourth duration, in which the fourth duration is longer than the second duration.

In some embodiments of the present disclosure, a method includes forming a dummy gate structure over a substrate; forming a plurality of gate spacers on opposite sidewalls of the dummy gate structure; forming an interlayer dielectric (ILD) layer surrounding the gate spacers; etching back the ILD layer to lower a top surface of the ILD layer; forming a hard mask over the ILD layer; replacing the dummy gate structure with a metal gate structure; etching back the metal gate structure to form a gate trench between the gate spacers; forming a plurality of first dielectric layers over the metal gate structure and the ILD layer, in which each of the first dielectric layers has a first portion over the metal gate structure and in contact with sidewalls of the gate spacers and a second portion over the ILD layer; and forming a second dielectric layer over the first dielectric layers, in which the second dielectric layer extends along sidewalls of the second portions of the first dielectric layers and sidewalls of the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate structure over a substrate;
   forming a plurality of gate spacers on opposite sidewalls of the dummy gate structure;
   forming an interlayer dielectric (ILD) layer surrounding the gate spacers;
   replacing the dummy gate structure with a metal gate structure;
   etching back the metal gate structure to form a gate trench between the gate spacers;
   depositing a first dielectric layer in the gate trench, wherein the first dielectric layer has horizontal portions over the metal gate structure and the ILD layer, and vertical portions on sidewalls of the gate spacers;
   etching the vertical portions of the first dielectric layer until the sidewalls of the gate spacers are exposed; and
   performing depositing the first dielectric layer and etching the vertical portions of the first dielectric layer in an alternate manner.

2. The method of claim 1, wherein the first dielectric layer is deposited by a PEALD process, and the first dielectric layer is deposited such that the horizontal portions of the first dielectric layer have a higher etching resistance to an etchant for etching the vertical portions of the first dielectric layer than the vertical portions of the first dielectric layer.

3. The method of claim 1, wherein performing depositing the first dielectric layer and etching the vertical portions of the first dielectric layer in an alternate manner is performed until a top surface of a topmost first dielectric layer is higher than a top surface of the ILD layer.

4. The method of claim 1, further comprising:
   depositing a second dielectric layer in the gate trench after performing depositing the first dielectric layer and etching the vertical portions of the first dielectric layer in an alternate manner, wherein the second dielectric layer extends along the sidewalls of the gate spacers; and
   performing a CMP process to the second dielectric layer until a top surface of the ILD layer is exposed.

5. The method of claim 1, further comprising:
   etching back the ILD layer to lower a top surface of the ILD layer prior to etching back the metal gate structure;
   forming a hard mask over the etched ILD layer; and
   performing a CMP process until a top surface of the metal gate structure is exposed.

6. The method of claim 5, wherein performing depositing the first dielectric layer and etching the vertical portions of the first dielectric layer in an alternate manner is performed such that a top surface of a topmost first dielectric layer is higher than a bottom surface of the hard mask and lower than a top surface of the hard mask.

7. The method of claim 1, wherein depositing a first dielectric layer is performed such that the horizontal portions of the first dielectric layer are thicker than the vertical portions of the first dielectric layer.

8. A method, comprising:
   etching back a metal gate structure to form a gate trench between gate spacers on opposite sidewalls of the metal gate structure;
   forming a first dielectric layer in the gate trench by a first PEALD process, wherein a deposition cycle of the first PEALD process comprises:
   exposing the gate trench to a first precursor for a first duration;
   providing a directional plasma into the gate trench; and
   exposing the gate trench to a second precursor for a second duration;
   removing vertical portions of the first dielectric layer to expose sidewalls of the gate spacers; and
   forming a second dielectric layer in the gate trench by a second PEALD process, wherein a deposition cycle of the second PEALD process comprises:
   exposing the gate trench to the first precursor for a third duration;
   providing the directional plasma into the gate trench; and
   exposing the gate trench to the second precursor for a fourth duration, wherein the fourth duration is longer than the second duration.

9. The method of claim 8, wherein forming the second dielectric layer is performed such that the second dielectric layer is in contact with the sidewalls of the gate spacers.

10. The method of claim 9, wherein forming the second dielectric layer is performed such that the second dielectric layer is separated from top surfaces of the gate spacers at least in part by the first dielectric layer.

11. The method of claim 8, wherein forming the first dielectric layer and removing vertical portions of the first dielectric layer are defined as a deposition-etch cycle, and the method further comprises performing a plurality of times of the deposition-etch cycle prior to forming the second dielectric layer.

12. The method of claim 11, wherein the deposition-etch cycle is performed 6 times to 10 times.

13. The method of claim 8, wherein the first duration is substantially the same as the third duration.

14. The method of claim 8, wherein removing the vertical portions of the first dielectric layer is performed such that horizontal portions of the first dielectric layer remain over top surfaces of the gate spacers and a top surface of the metal gate structure.

15. A method, comprising:
   forming a dummy gate structure over a substrate;
   forming a plurality of gate spacers on opposite sidewalls of the dummy gate structure;
   forming an interlayer dielectric (ILD) layer surrounding the gate spacers;
   etching back the ILD layer to lower a top surface of the ILD layer;
   forming a hard mask over the ILD layer;
   replacing the dummy gate structure with a metal gate structure;
   etching back the metal gate structure to form a gate trench between the gate spacers;
   forming a plurality of first dielectric layers over the metal gate structure and the ILD layer, wherein each of the first dielectric layers has a first portion over the metal gate structure and in contact with sidewalls of the gate spacers and a second portion over the ILD layer; and
   forming a second dielectric layer over the first dielectric layers, wherein the second dielectric layer extends along sidewalls of the second portions of the first dielectric layers and sidewalls of the gate spacers.

16. The method of claim 15, wherein forming each of the first dielectric layers comprises:
   depositing a dielectric material in the gate trench, wherein the dielectric material has horizontal portions over the metal gate structure and the ILD layer, and vertical portions over the sidewalls of the gate spacers; and
   removing the vertical portions of the dielectric material until the sidewalls of the gate spacers are exposed.

17. The method of claim 15, wherein:
   forming the first dielectric layers is performed such that the first dielectric layers are free of seam; and
   forming the second dielectric layer is performed such that a seam is formed in the second dielectric layer.

18. The method of claim 17, wherein a bottom end of the seam of the second dielectric layer is higher than the top surface of the ILD layer.

19. The method of claim 17, further comprising performing a CMP process to the first dielectric layers and the second dielectric layer until the top surface of the ILD layer is exposed, wherein the seam of the second dielectric layer is removed after the CMP process.

20. The method of claim 15, further comprising performing a CMP process to the first dielectric layers and the second dielectric layer such that an entirety of the second dielectric layer is removed.

* * * * *